United States Patent
Adrian et al.

(10) Patent No.: US 11,032,934 B1
(45) Date of Patent: Jun. 8, 2021

(54) APPARATUS, SYSTEM, AND METHOD FOR ENABLING MULTIPLE STORAGE-SYSTEM CONFIGURATIONS

(71) Applicant: Facebook, Inc., Menlo Park, CA (US)

(72) Inventors: Jason David Adrian, San Jose, CA (US); Dominic Kai Yin Cheng, Mississauga (CA); Austin Joel Cousineau, Menlo Park, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 16/876,159

(22) Filed: May 18, 2020

Related U.S. Application Data

(63) Continuation of application No. 15/688,830, filed on Aug. 28, 2017, now Pat. No. 10,687,435.

(51) Int. Cl.
*H05K 7/14* (2006.01)
*G11B 33/12* (2006.01)
*G11B 33/04* (2006.01)

(52) U.S. Cl.
CPC ....... *H05K 7/1498* (2013.01); *G11B 33/0461* (2013.01); *G11B 33/122* (2013.01); *G11B 33/128* (2013.01); *H05K 7/1487* (2013.01)

(58) Field of Classification Search
None
See application file for complete search history.

(56) References Cited

U.S. PATENT DOCUMENTS

| | | |
|---|---|---|
| 355,538 A | 1/1887 | Keyes |
| 517,703 A | 4/1894 | Ludwig |
| 922,852 A | 5/1909 | Cannan |
| 1,062,733 A | 5/1913 | Rahotina |

(Continued)

FOREIGN PATENT DOCUMENTS

| | | |
|---|---|---|
| DE | 10 2009 023 341 A1 | 2/2011 |
| EP | 2 896 852 A1 | 7/2015 |

OTHER PUBLICATIONS

Final Office Action received for U.S. Appl. No. 15/687,406 dated Sep. 12, 2018, 13 pages.

(Continued)

*Primary Examiner* — Xanthia C Cunningham
(74) *Attorney, Agent, or Firm* — FisherBroyles, LLP

(57) ABSTRACT

A configurable storage-system drawer may include (1) a chassis, (2) a slide assembly coupled to a side of the chassis that is configured to enable the chassis to be temporarily pulled out of a data-center rack, and (3) a passive drive-plane board housed within the chassis and configured to enable storage-system modules that differ between two or more storage-system configurations of the storage-system drawer to be interchanged. In some examples, the passive drive-plane board may include (1) storage-drive connectors that are each configured to detachably mate with a storage drive, (2) a storage-system-module connector configured to detachably mate with a storage-system module that includes one or more components necessary for one of the two or more storage-system configurations, and (3) electrical interconnects that electrically couple the storage-drive connectors to the storage-system-module connector. Various other apparatus, systems, and methods for enabling multiple storage-system configurations are also disclosed.

20 Claims, 13 Drawing Sheets

(56) References Cited

U.S. PATENT DOCUMENTS

| | | | |
|---|---|---|---|
| 1,516,692 A | 11/1924 | Andreas | |
| 1,777,074 A | 9/1930 | Cordrey | |
| 3,447,850 A | 6/1969 | Samson | |
| 3,536,348 A | 10/1970 | Tedesco | |
| 3,601,463 A | 8/1971 | Watt et al. | |
| 3,711,140 A | 1/1973 | Onori | |
| 3,996,500 A | 12/1976 | Coules | |
| D294,800 S | 3/1988 | Nilsson | |
| 4,969,065 A | 11/1990 | Petri | |
| 4,993,762 A | 2/1991 | Rogers et al. | |
| 5,262,705 A | 11/1993 | Hattori | |
| 5,281,149 A | 1/1994 | Petri | |
| 5,724,803 A | 3/1998 | Pea | |
| 5,793,614 A | 8/1998 | Tollbom | |
| 5,957,659 A | 9/1999 | Amou et al. | |
| 6,021,044 A | 2/2000 | Neville, Jr. et al. | |
| 6,109,767 A | 8/2000 | Rodriguez | |
| 6,116,375 A | 9/2000 | Lorch et al. | |
| 6,159,031 A | 12/2000 | Llapitan et al. | |
| 6,181,549 B1 | 1/2001 | Mills et al. | |
| 6,259,032 B1 | 7/2001 | Fernandez | |
| 6,260,441 B1 | 7/2001 | Landl | |
| 6,331,915 B1 | 12/2001 | Myers | |
| 6,373,707 B1 | 4/2002 | Hutchins | |
| 6,385,036 B1 | 5/2002 | Chien | |
| 6,385,051 B1 | 5/2002 | Perez et al. | |
| 6,404,646 B1 | 6/2002 | Tsai et al. | |
| 6,469,899 B2 | 10/2002 | Hastings et al. | |
| 6,515,854 B1 | 2/2003 | Claprood | |
| 6,535,394 B1 | 3/2003 | Hirzmann | |
| 6,545,879 B1 | 4/2003 | Goodwin | |
| 6,552,915 B2 * | 4/2003 | Takahashi | H05K 7/1418 361/752 |
| 6,556,433 B1 | 4/2003 | Love et al. | |
| 6,621,692 B1 | 9/2003 | Johnson et al. | |
| 6,695,629 B1 | 2/2004 | Mayer | |
| 6,786,691 B2 | 9/2004 | Alden, III | |
| 6,791,843 B1 | 9/2004 | Dobbs et al. | |
| 6,798,669 B1 | 9/2004 | Hsu | |
| 6,813,165 B2 | 11/2004 | Cheng et al. | |
| 6,921,227 B1 | 7/2005 | De Jong et al. | |
| 6,987,674 B2 * | 1/2006 | El-Batal | G11B 25/043 361/679.37 |
| 6,992,885 B2 | 1/2006 | Wang | |
| 6,995,982 B2 | 2/2006 | Gonzalez et al. | |
| 7,004,764 B2 | 2/2006 | Boudreau et al. | |
| 7,084,654 B2 | 8/2006 | Zhao et al. | |
| 7,085,131 B2 | 8/2006 | Peng et al. | |
| 7,088,579 B1 | 8/2006 | Konshak | |
| 7,167,371 B2 | 1/2007 | Coles et al. | |
| 7,301,778 B1 | 11/2007 | Fang | |
| 7,304,855 B1 * | 12/2007 | Milligan | G11B 33/128 361/724 |
| 7,408,770 B2 | 8/2008 | Peng et al. | |
| 7,411,787 B2 | 8/2008 | Katakura et al. | |
| 7,423,354 B2 | 9/2008 | Suzuki et al. | |
| 7,505,286 B2 | 3/2009 | Brovald et al. | |
| 7,515,413 B1 | 4/2009 | Curtis | |
| 7,649,750 B2 | 1/2010 | Lee | |
| 7,826,208 B2 | 11/2010 | Wang et al. | |
| 8,020,902 B1 | 9/2011 | Li | |
| 8,064,195 B2 | 11/2011 | Zhang et al. | |
| 8,127,059 B1 | 2/2012 | Carr et al. | |
| 8,203,851 B2 * | 6/2012 | Boetzer | G06F 1/186 361/801 |
| 8,310,828 B2 | 11/2012 | Collins | |
| 8,331,095 B2 | 12/2012 | Hu et al. | |
| 8,369,080 B2 | 2/2013 | Huang | |
| 8,517,054 B2 | 8/2013 | Lai et al. | |
| 8,570,720 B2 | 10/2013 | Yao et al. | |
| 8,585,336 B2 | 11/2013 | Tao et al. | |
| 8,622,673 B2 | 1/2014 | Wong et al. | |
| 8,636,528 B2 | 1/2014 | Sass et al. | |
| 8,657,619 B2 | 2/2014 | Lin et al. | |
| 8,743,549 B2 | 6/2014 | Frink et al. | |
| 8,749,966 B1 | 6/2014 | Boudreau et al. | |
| 8,770,681 B2 | 7/2014 | Hu | |
| 8,848,349 B2 | 9/2014 | Ke | |
| 8,944,538 B2 | 2/2015 | Li | |
| 8,971,052 B2 | 3/2015 | Fu | |
| 8,979,458 B2 | 3/2015 | Sun et al. | |
| 9,066,438 B2 | 6/2015 | Chen | |
| 9,070,419 B1 | 6/2015 | Zhu et al. | |
| 9,098,233 B2 | 8/2015 | Keffeler | |
| 9,101,210 B2 | 8/2015 | Lin | |
| 9,113,567 B2 | 8/2015 | Stotz, Jr. | |
| 9,203,188 B1 | 12/2015 | Siechen et al. | |
| 9,274,548 B2 * | 3/2016 | Foisy | H05K 7/1445 |
| 9,298,230 B2 | 3/2016 | Wei | |
| 9,313,909 B1 | 4/2016 | Huang | |
| 9,354,003 B2 | 5/2016 | Lin | |
| 9,448,601 B1 | 9/2016 | Beall et al. | |
| 9,454,190 B2 | 9/2016 | Mao et al. | |
| 9,456,519 B2 | 9/2016 | Bailey et al. | |
| 9,461,389 B2 | 10/2016 | Novack et al. | |
| 9,474,190 B2 | 10/2016 | Beall et al. | |
| 9,538,684 B2 | 1/2017 | Chen et al. | |
| 9,545,028 B2 | 1/2017 | Hoshino et al. | |
| 9,572,276 B2 | 2/2017 | Haroun | |
| 9,583,877 B1 | 2/2017 | Angelucci | |
| 9,609,778 B1 | 3/2017 | Spencer et al. | |
| 9,763,350 B2 | 9/2017 | Rust et al. | |
| 9,763,353 B1 | 9/2017 | Beall | |
| 9,795,052 B2 | 10/2017 | Hsiao et al. | |
| 9,936,611 B1 | 4/2018 | Beall et al. | |
| 9,949,407 B1 | 4/2018 | Beall | |
| 10,058,006 B2 | 8/2018 | Huang et al. | |
| 10,165,703 B1 | 12/2018 | Adrian | |
| 10,178,791 B1 | 1/2019 | Kho | |
| 10,240,615 B1 | 3/2019 | Kho et al. | |
| 10,264,698 B2 | 4/2019 | Kho et al. | |
| 10,354,699 B1 | 7/2019 | Gopalkrishna et al. | |
| 10,372,360 B2 | 8/2019 | Adrian | |
| 10,687,435 B2 | 6/2020 | Adrian et al. | |
| 2003/0112594 A1 | 6/2003 | Smith | |
| 2003/0123221 A1 * | 7/2003 | Liao | G06F 1/186 361/679.31 |
| 2003/0183448 A1 | 10/2003 | Sleet et al. | |
| 2003/0200472 A1 | 10/2003 | Midorikawa et al. | |
| 2003/0200475 A1 | 10/2003 | Komoto | |
| 2004/0052046 A1 | 3/2004 | Regimbal et al. | |
| 2004/0227443 A1 | 11/2004 | Sandoval | |
| 2005/0057909 A1 | 3/2005 | El-Batal et al. | |
| 2005/0136747 A1 | 6/2005 | Caveney et al. | |
| 2005/0162099 A1 | 7/2005 | Kemper | |
| 2005/0182874 A1 | 8/2005 | Herz et al. | |
| 2005/0238421 A1 | 10/2005 | Doerr et al. | |
| 2006/0075155 A1 | 4/2006 | Fuller et al. | |
| 2006/0134953 A1 | 6/2006 | Williams et al. | |
| 2006/0146507 A1 | 7/2006 | Lee | |
| 2006/0198097 A1 | 9/2006 | Kuwajima et al. | |
| 2006/0274508 A1 | 12/2006 | LaRiviere et al. | |
| 2007/0195542 A1 | 8/2007 | Metros et al. | |
| 2007/0230111 A1 | 10/2007 | Starr et al. | |
| 2007/0233781 A1 * | 10/2007 | Starr | G11B 33/128 709/203 |
| 2007/0234081 A1 | 10/2007 | Makino et al. | |
| 2008/0007913 A1 | 1/2008 | Sullivan et al. | |
| 2008/0056844 A1 | 3/2008 | Aukzemas et al. | |
| 2008/0117569 A1 | 5/2008 | Lee | |
| 2008/0174949 A1 | 7/2008 | Lai et al. | |
| 2008/0195786 A1 | 8/2008 | Lee | |
| 2008/0239650 A1 | 10/2008 | Fujie et al. | |
| 2008/0264192 A1 | 10/2008 | Christensen | |
| 2009/0245745 A1 | 10/2009 | Krampotich et al. | |
| 2009/0271950 A1 | 11/2009 | Wang | |
| 2009/0274429 A1 | 11/2009 | Krampotich et al. | |
| 2009/0310303 A1 | 12/2009 | Najbert | |
| 2010/0153608 A1 | 6/2010 | Olesiewicz et al. | |
| 2010/0195304 A1 | 8/2010 | Takao | |
| 2010/0296791 A1 | 11/2010 | Makrides-Saravanos et al. | |
| 2011/0208937 A1 | 8/2011 | Hayashi et al. | |
| 2011/0273850 A1 | 11/2011 | Chen | |
| 2011/0299237 A1 | 12/2011 | Liang | |

(56) References Cited

U.S. PATENT DOCUMENTS

| | | |
|---|---|---|
| 2011/0309730 A1 | 12/2011 | Retchloff et al. |
| 2012/0004772 A1 | 1/2012 | Rahilly et al. |
| 2012/0020006 A1 | 1/2012 | Xu et al. |
| 2012/0134086 A1 | 5/2012 | Zhang |
| 2012/0230815 A1 | 9/2012 | Teramoto et al. |
| 2012/0243170 A1 | 9/2012 | Frink et al. |
| 2012/0257360 A1 | 10/2012 | Sun |
| 2012/0305745 A1 | 12/2012 | Chen et al. |
| 2012/0320519 A1 | 12/2012 | Wu et al. |
| 2013/0050955 A1* | 2/2013 | Shinsato ............... G06F 1/187 |
| | | 361/727 |
| 2013/0058054 A1 | 3/2013 | Zhou |
| 2013/0162127 A1 | 6/2013 | Hu |
| 2013/0258580 A1 | 10/2013 | Nakayama |
| 2013/0325183 A1 | 12/2013 | Rahilly |
| 2014/0111930 A1 | 4/2014 | Henderson |
| 2014/0118936 A1 | 5/2014 | Merlet et al. |
| 2014/0187068 A1 | 7/2014 | Chia et al. |
| 2014/0191636 A1 | 7/2014 | Li |
| 2014/0203696 A1 | 7/2014 | Rust et al. |
| 2014/0247569 A1 | 9/2014 | Foisy et al. |
| 2014/0362521 A1 | 12/2014 | Pronozuk et al. |
| 2014/0369002 A1 | 12/2014 | Takeuchi et al. |
| 2015/0156912 A1 | 6/2015 | Liang et al. |
| 2015/0163946 A1 | 6/2015 | Kyle et al. |
| 2015/0208548 A1 | 7/2015 | Chu et al. |
| 2015/0235673 A1 | 8/2015 | Lo |
| 2015/0320204 A1 | 11/2015 | Byrne et al. |
| 2015/0380059 A1 | 12/2015 | Bell et al. |
| 2016/0018859 A1 | 1/2016 | Mao et al. |
| 2016/0042768 A1 | 2/2016 | Yang et al. |
| 2016/0150659 A1 | 5/2016 | Chen et al. |
| 2016/0150667 A1 | 5/2016 | Xu et al. |
| 2016/0330858 A1 | 11/2016 | Ehlen |
| 2016/0381824 A1 | 12/2016 | Chu |
| 2017/0325361 A1 | 11/2017 | Chen et al. |
| 2018/0027059 A1 | 1/2018 | Miller |
| 2018/0168071 A1 | 6/2018 | Edge et al. |
| 2018/0260349 A1 | 9/2018 | Mondal et al. |
| 2019/0069432 A1 | 2/2019 | Kho et al. |
| 2019/0069440 A1 | 2/2019 | Adrian |
| 2019/0073008 A1 | 3/2019 | Adrian |
| 2019/0075668 A1 | 3/2019 | Adrian et al. |
| 2019/0079565 A1 | 3/2019 | Adrian |
| 2019/0090374 A1 | 3/2019 | Kho et al. |
| 2019/0090376 A1 | 3/2019 | Kho et al. |
| 2019/0098795 A1 | 3/2019 | Adrian |

OTHER PUBLICATIONS

Notice of Allowance received for U.S. Appl. No. 15/687,406 dated Dec. 19, 2018, 23 pages.
Non-Final Office Action received for U.S. Appl. No. 15/708,075 dated Feb. 10, 2020, 36 pages.
Final Office Action received for U.S. Appl. No. 15/708,075 dated Jul. 17, 2020, 37 pages.
Non-Final Office Action received for U.S. Appl. No. 15/713,609 dated Jun. 26, 2018, 33 pages.
Notice of Allowance received for U.S. Appl. No. 15/713,609 dated Nov. 15, 2018, 28 pages.
Non-Final Office Action received for U.S. Appl. No. 15/688,830 dated Sep. 5, 2018, 54 pages.
Final Office Action received for U.S. Appl. No. 15/688,830 dated Mar. 19, 2019, 5 pages.
Non-Final Office Action received for U.S. Appl. No. 15/688,830 dated Jul. 30, 2019, 20 pages.
Notice of Allowance received for U.S. Appl. No. 15/688,830 dated Feb. 10, 2020, 36 pages.
Jason David Adrian et al.; Apparatus, System, and Method for Reconfigurable Media-Agnostic Storage; U.S. Appl. No. 15/694,068, filed Sep. 1, 2017.
Jason David Adrian; Apparatus, System, and Method for Indicating the Status of and Securing Hard Drives; U.S. Appl. No. 15/700,112, filed Sep. 9, 2017.
Jason David Adrian; Apparatus, System, and Method for Directing Air in a Storage-System Chassis; U.S. Appl. No. 15/689,650, filed Aug. 29, 2017.
Jason David Adrian et al.; Apparatus, System, and Method for Securing Hard Drives in a Storage Chassis; U.S. Appl. No. 15/697,405, filed Sep. 6, 2017.
Jason David Adrian; Apparatus, System, and Method for Detecting Device Types of Storage Devices; U.S. Appl. No. 15/698,540, filed Sep. 7, 2017.
Chuankeat Kho et al.; Removeable Drive-Plane Apparatus, System, and Method; U.S. Appl. No. 15/693,362, filed Aug. 31, 2017.
Chuankeat Kho et al.; Systems and Methods for Mounting Assembly Pullhandles; U.S. Appl. No. 15/687,406, filed Aug. 25, 2017.
Jason David Adrian; An Apparatus, System, and Method for Reconfiguring Air Flow Through a Chassis; U.S. Appl. No. 15/716,251, filed Sep. 26, 2017.
Jason Adrian; Introducing Bryce Canyon: Our next-generation storage platform; https://code.facebook.com/posts/1869788206569924/introducing-bryce-canyon-our-next-generation-storage-platform/; Mar. 8, 2017.
Jason Adrian et al.; Bryce Canyon Storage Specification; Jan. 31, 2017.
Open Compute Project; http://opencompute.org/; as accessed Sep. 29, 2017.
Jason David Adrian; Data-Center Drawer and Cable Track Assembly; U.S. Appl. No. 15/720,647, filed Sep. 29, 2017.
Sisson; How Facebook Does Storage; https://thenewstack.io/facebook-storage.
What's the Difference Between SATA and SAS Hard Drives?; https://www.pickaweb.co.uk/kb/difference-between-sata-sas-hard-drives/.
Chuankeat Kho; Apparatus, System, and Method for Securing Computing Components to Printed Circuit Boards; U.S. Appl. No. 15/713,607, filed Sep. 23, 2017.
Chuankeat Kho et al.; Apparatus, System, and Method for Partitioning a Storage-System Chassis; U.S. Appl. No. 15/708,069, filed Sep. 18, 2017.
Chuankeat Kho et al.; Apparatus, System, and Method for Dampening Vibrations Generated by Exhaust Fans; U.S. Appl. No. 15/713,609, filed Sep. 23, 2017.
Chuankeat Kho et al.; Apparatus, System, and Method for Resisting Shock to a Data-Center Rack; U.S. Appl. No. 15/708,075, filed Sep. 18, 2017.
Acoustic Attenuation; https://en.wikipedia.org/wiki/Acoustic attenuation; Oct. 22, 2012.
Electromagnetic Shielding; https://en.wikipedia.org/wiki/Electromagnetic_shielding; May 15, 2016.
Non-Final Office Action received for U.S. Appl. No. 15/700,112 dated Aug. 9, 2018, 15 pages.
Final Office Action received for U.S. Appl. No. 15/700,112 dated Jan. 2, 2019, 10 pages.
Non-Final Office Action received for U.S. Appl. No. 15/700,112 dated May 30, 2018, 13 pages.
Notice of Allowance received for U.S. Appl. No. 15/700,112 dated Oct. 2, 2019, 64 pages.
Non-Final Office Action received for U.S. Appl. No. 15/689,650 dated Sep. 24, 2018, 38 pages.
Notice of Allowance received for U.S. Appl. No. 15/689,650 dated Feb. 28, 2019, 44 pages.
Non-Final Office Action received for U.S. Appl. No. 15/716,251 dated Aug. 8, 2019, 50 pages.
Final Office Action received for U.S. Appl. No. 15/716,251 dated Jan. 13, 2020, 39 pages.
Notice of Allowance received for U.S. Appl. No. 15/716,251 dated Apr. 22, 2020, 49 pages.
Non-Final Office Action received for U.S. Appl. No. 15/720,647 dated May 18, 2018, 45 pages.
Notice of Allowance received for U.S. Appl. No. 15/720,647 dated Aug. 15, 2018, 23 pages.
Non-Final Office Action received for U.S. Appl. No. 15/697,405 dated Jun. 7, 2018, 33 pages.

(56) References Cited

OTHER PUBLICATIONS

Final Office Action received for U.S. Appl. No. 15/697,405 dated Dec. 13, 2018, 46 pages.
Non-Final Office Action received for U.S. Appl. No. 15/697,405 dated May 21, 2019, 64 pages.
Notice of Allowance received for U.S. Appl. No. 15/697,405 dated Oct. 31, 2019, 60 pages.
Non-Final Office Action received for U.S. Appl. No. 15/698,540 dated Nov. 14, 2018, 40 pages.
Notice of Allowance received for U.S. Appl. No. 15/698,540 dated May 30, 2019, 29 pages.
Non-Final Office Action received for U.S. Appl. No. 15/694,068 dated Nov. 19, 2018, 18 pages.
Notice of Allowance received for U.S. Appl. No. 15/694,068 dated Mar. 15, 2019, 23 pages.
Non-Final Office Action received for U.S. Appl. No. 15/693,362 dated Dec. 19, 2019, 53 pages.
Notice of Allowance received for U.S. Appl. No. 15/693,362 dated Apr. 2, 2020, 33 pages.
Non-Final Office Action received for U.S. Appl. No. 15/713,607 dated Apr. 16, 2018, 39 pages.
Notice of Allowance received for U.S. Appl. No. 15/713,607 dated Sep. 6, 2018, 22 pages.
Non-Final Office Action received for U.S. Appl. No. 15/708,069 dated Apr. 30, 2019, 52 pages.
Notice of Allowance received for U.S. Appl. No. 15/708,069 dated Oct. 23, 2019, 54 pages.
Non-Final Office Action received for U.S. Appl. No. 15/687,406 dated Mar. 21, 2018, 33 pages.

\* cited by examiner

APPARATUS, SYSTEM, AND METHOD FOR ENABLING MULTIPLE STORAGE-SYSTEM CONFIGURATIONS

CROSS REFERENCE TO RELATED APPLICATION

This application is a continuation of U.S. application Ser. No. 15/688,830, filed 28 Aug. 2017, the disclosure of which is incorporated, in its entirety, by this reference.

BACKGROUND

Today, many entities must create and manage complex data centers capable of storing and accessing hundreds of terabytes of data (e.g., text, image, and video data) that are generated and consumed every day by their users. These complex data centers often need to be capable of creating and storing duplicate copies of this data for disaster-recovery, testing, regulatory, or other purposes. Generally, different types of data have different storage requirements. Moreover, the storage requirements for any particular instance of data may change over time. For example, new or popular data may be considered "hot data" and need to be stored to fast storage devices and managed by fast servers. Alternatively, old or unpopular data may be considered "cold data" that may be stored to slower storage devices and/or managed by slower servers.

A typical data center generally includes different types of storage systems that have each been designed and configured for a single fixed purpose (e.g., warm-data storage, cold-data storage, etc.). Unfortunately, these different types of storage systems often use or require different types of components (e.g., different types of storage devices, storage controllers, servers, and network interfaces) that each operate and/or interface using one of several incompatible protocols or technologies. These complexities may make managing, configuring, servicing, replacing, and reconfiguring a data center's storage-system components difficult for those individuals enlisted to perform these tasks.

SUMMARY

As will be described in greater detail below, the instant disclosure describes various apparatus, systems, and methods that enable a flexible storage-system drawer platform to take on many different storage-system configurations. In one example, a configurable storage-system drawer may include (1) a chassis, (2) a slide assembly coupled to a side of the chassis that is configured to enable the chassis to be temporarily pulled out of a data-center rack, and (3) a passive drive-plane board housed within the chassis and configured to enable storage-system modules that differ between two or more storage-system configurations of the storage-system drawer to be interchanged. In some examples, the passive drive-plane board may include (1) storage-drive connectors that are each configured to detachably mate with a storage drive, (2) a storage-system-module connector configured to detachably mate with a storage-system module that includes one or more components necessary for one of the two or more storage-system configurations, and (3) electrical interconnects that electrically couple the storage-drive connectors to the storage-system-module connector.

In some examples, the two or more storage-system configurations of the storage-system drawer may include a single-server configuration, a dual-server configuration, and/or a just-a-bunch-of-drives (JBOD) configuration. In some examples, the single-server configuration may require a first type of input/output module, the dual-server configuration may require a second type of input/output module, and the storage-system-module connector may be an input/output-module connector configured to accept any input/output module of the first type or any input/output module of the second type. In at least one example, the single-server configuration may require a first type of storage-controller module, the dual-server configuration may require a second type of storage-controller module, the JBOD configuration may require a third type of storage-controller module, and the storage-system-module connector may be a storage-controller-module connector configured to accept any storage-controller module of the first type, any storage-controller module of the second type, and/or any storage-controller module of the third type.

In some examples, the single-server configuration may require a first type of input/output module, one compute module, and a first type of storage-controller module; the dual-server configuration may require a second type of input/output module, two compute modules, and a second type of storage-controller module; and the JBOD configuration may require no input/output modules, no compute modules, but a third type of storage-controller module. In these examples, the storage-system-module connector may be a storage-controller-module connector configured to accept any storage-controller module of the first type, any storage-controller module of the second type, or any storage-controller module of the third type. In addition, the passive drive-plane board may further include (1) an input/output-module connector configured to accept any input/output module of the first type or any input/output module of the second type and (2) two compute-module connectors that each are configured to accept a compute module. In some examples, the storage-system-module connector may be a compute-module connector configured to detachably mate with a compute module that includes a central processing unit.

In at least one example, the chassis may include a front through which air is able to pass and a rear through which air is able to pass, and the configurable storage-system drawer may further include (1) a fan coupled to a rear of the chassis that is configured to pull an airflow rearward through the chassis and (2) airflow-retaining members that are configured to cause substantially all of the airflow to enter the chassis through the front of the chassis when the configurable storage-system drawer is pulled out of the data-center rack. In at least one example, the storage-system module may be an input/output module having a heatsink, and one of the airflow-retaining members may include an opening that is configured to enable a portion of the airflow to bypass the front of the chassis and instead pass from under the configurable storage-system drawer across the heatsink. In some examples, the slide assembly may include (1) a first dampening member configured to reduce a shock applied to the chassis when the configurable storage-system drawer is pulled out of the data-center rack and (2) a second dampening member configured to reduce a shock applied to the chassis when the configurable storage-system drawer is pushed into the data-center rack.

According to various embodiments, a corresponding storage-system drawer may include (1) storage drives, (2) a first storage-controller module that includes one or more storage-controller components necessary for one of two or more configurations of the storage-system drawer, (3) a second storage-controller module that includes the one or more storage-controller components necessary for one of the two or more configurations of the storage-system drawer, (4) a chassis, (5) a slide assembly coupled to a side of the chassis configured to enable the chassis to be temporarily pulled out of a data-center rack, and (6) a passive drive-plane board housed within the chassis and configured to enable storage-system modules that differ between the two or more configurations of the storage-system drawer to be interchanged. In some examples, the passive drive-plane board may include (1) storage-drive connectors that each are configured to detachably mate with one of the storage drives, (2) two storage-controller-module connectors that each are configured to detachably mate with the first storage-controller module or the second storage-controller module, (3) two input/output-module connectors that each are configured to detachably mate with an input/output module that includes one or more input/output components necessary for one of the two or more storage-system configurations, (4) two compute-module connectors that each are configured to detachably mate with a compute module that includes a central processing unit necessary for one of the two or more storage-system configurations, and (5) electrical interconnects that electrically couple the storage-drive connectors, the two storage-controller-module connectors, the two input/output-module connectors, and/or the two compute-module connectors.

In some examples, the two or more configurations of the storage-system drawer may include a single-server configuration, a dual-server configuration, and/or a JBOD configuration. In some examples, the single-server configuration may require a first type of storage-controller module, the dual-server configuration may require a second type of storage-controller module, the JBOD configuration may require a third type of storage-controller module, and the two storage-controller-module connectors may be configured to accept any storage-controller module of the first type, any storage-controller module of the second type, or any storage-controller module of the third type. In some examples, the single-server configuration may require a first type of input/output module, the dual-server configuration may require a second type of input/output module, and the two input/output-module connectors may be configured to accept any input/output module of the first type or any input/output module of the second type.

In certain examples, the single-server configuration may require a first type of input/output module, one compute module, and a first type of storage-controller module; the dual-server configuration may require a second type of input/output module, two compute modules, and a second type of storage-controller module; and the JBOD configuration may require no input/output modules, no compute modules, but a third type of storage-controller module. In one example, the storage-system drawer may have the single-server configuration, the first storage-controller module and the second storage-controller module may be of the first type of storage-controller module, and the storage-system drawer may further include an input/output module of the first type of input/output module coupled to one of the two input/output-module connectors and a compute module coupled to one of the two compute-module connectors. In another example, the storage-system drawer may have the dual-server configuration, the first storage-controller module and the second storage-controller module may be of the second type of storage-controller module, and the storage-system drawer may further include two input/output modules of the second type of input/output module coupled to the two input/output-module connectors and two compute modules coupled to the two compute-module connectors. In another example, the storage-system drawer may have the JBOD configuration, the first storage-controller module and the second storage-controller module may be of the third type of storage-controller module, the two input/output-module connectors may be empty, and the two compute-module connectors may be empty.

In addition to the various configurable storage-system drawers described herein, the instant disclosure presents exemplary methods associated with reconfiguring storage-system drawers. For example, a method may include pulling out a storage-system drawer capable of a first storage-system configuration and a second storage-system configuration from a data-center rack. In this example, the storage-system drawer may include (1) a chassis, (2) a slide assembly coupled to a side of the chassis and configured to enable the chassis to be temporarily pulled out of the data-center rack, (3) a first storage-system module that includes one or more components necessary for the first storage-system configuration, and (4) a passive drive-plane board housed within the chassis and configured to enable active storage-system modules that differ between the first storage-system configuration and the second storage-system configuration to be interchanged. In some examples, the passive drive-plane board may include (1) storage-drive connectors that each are configured to detachably mate with a storage drive, (2) a storage-controller-module connector configured to detachably mate with the first storage-system module, and (3) electrical interconnects that electrically couple the storage-drive connectors to the storage-controller-module connector. In some examples, the method may further include (1) removing the first storage-system module from the storage-controller-module connector, (2) inserting a second storage-system module into the storage-controller-module connector, with the second storage-system module including one or more components necessary for the second storage-system configuration, and (3) pushing the storage-system drawer back into the data-center rack.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

FIG. 12 is a bottom view of the exemplary storage-system drawer illustrated in

FIG. 10.

Figure 1:
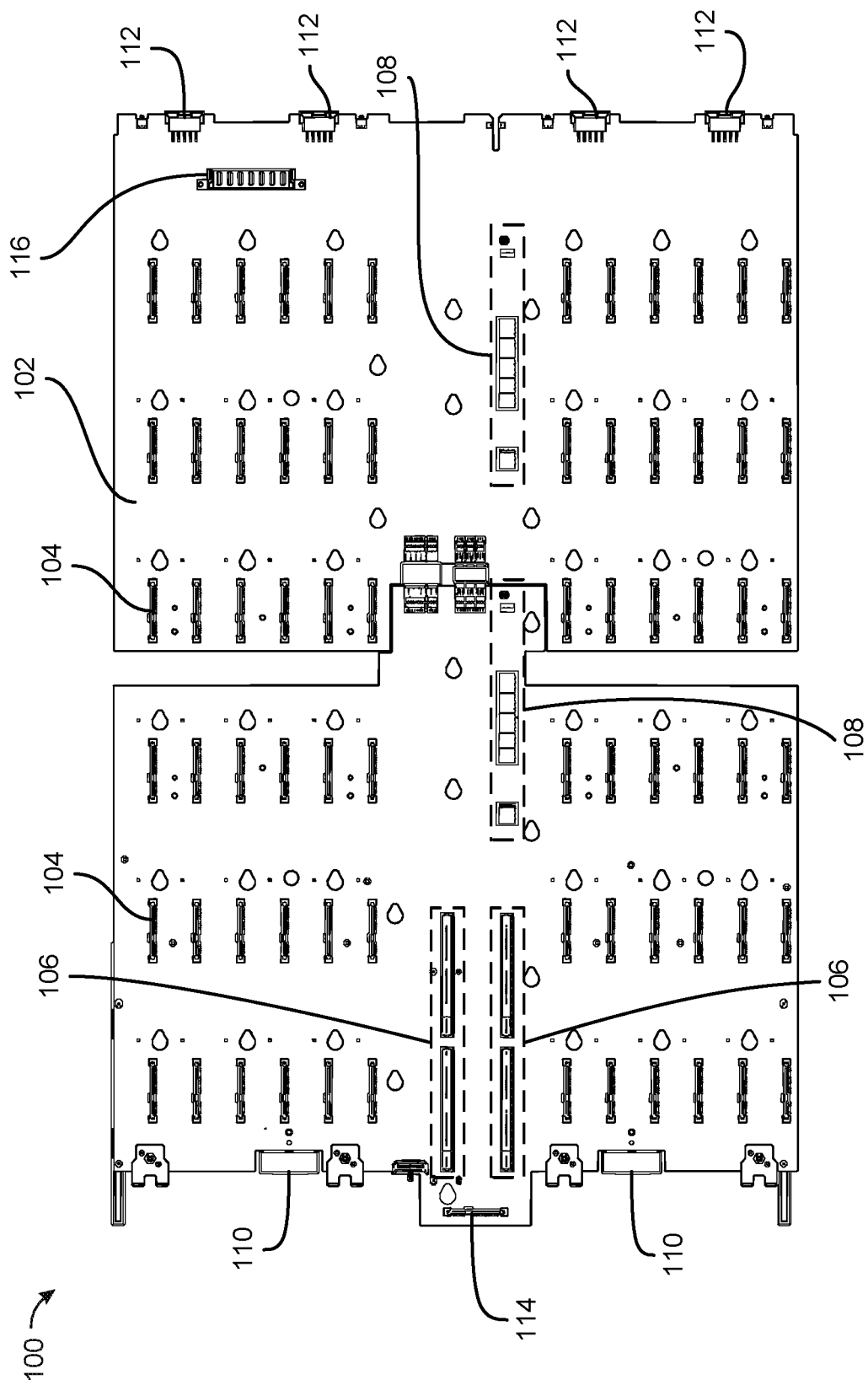
FIG. 1 is a top view of an exemplary passive drive-plane board.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to a flexible storage-system drawer platform that may support a variety of storage-system configurations, such as single-server configurations, dual-server configurations, and JBOD configurations. As will be explained in greater detail below, by including some or all of the common components shared between two or more possible configurations of a storage system in a passive drive-plane board and modularizing the components that differ, the apparatus, systems, and methods disclosed herein may enable a storage-system drawer that contains the passive drive-plane board to take on any one of the configurations and/or be later reconfigured to take on any of the others. In some examples, the passive drive-plane board may include various connectors and electrical interconnects configured to mechanically and electrically couple various types of modularized components, such as compute modules, storage drives, storage controllers, input/output modules, auxiliary components, and other active storage-system components. In some examples, the passive drive-plane board may be protocol and/or connector agnostic to enable different forms of each type of modularized component to be mixed and matched. In some examples, the flexible storage-system drawer platform may be substantially self-contained. For example, the flexible storage-system drawer platform may contain substantially all necessary power cabling, fans, and sensors needed for each supported storage-system configuration. The flexible storage-system drawer platform may also include various cutouts and baffles that enable the flexible storage-system drawer platform to be extended from a data-center rack for long periods of time for servicing purposes without its components overheating.

Embodiments of the instant disclosure may provide various features and advantages over conventional storage-system drawers. For example, the flexible storage-system drawer platform disclosed herein may allow for modularized storage-system components to be replaced by modularized storage-system components of other types, formats, and/or form factors without requiring the purchase or configuration of entirely new drawer hardware and/or the reconfiguration of data-center racks. In addition, the mechanisms disclosed herein may facilitate more efficient management of data center facilities. For example, the flexible storage-system drawer platform disclosed herein may enable data-center administrators to reconfigure a storage-system drawer to meet their changing needs by simply changing or replacing the storage-system drawer's modularized components rather than replacing the entire storage-system drawer.

Figure 2:
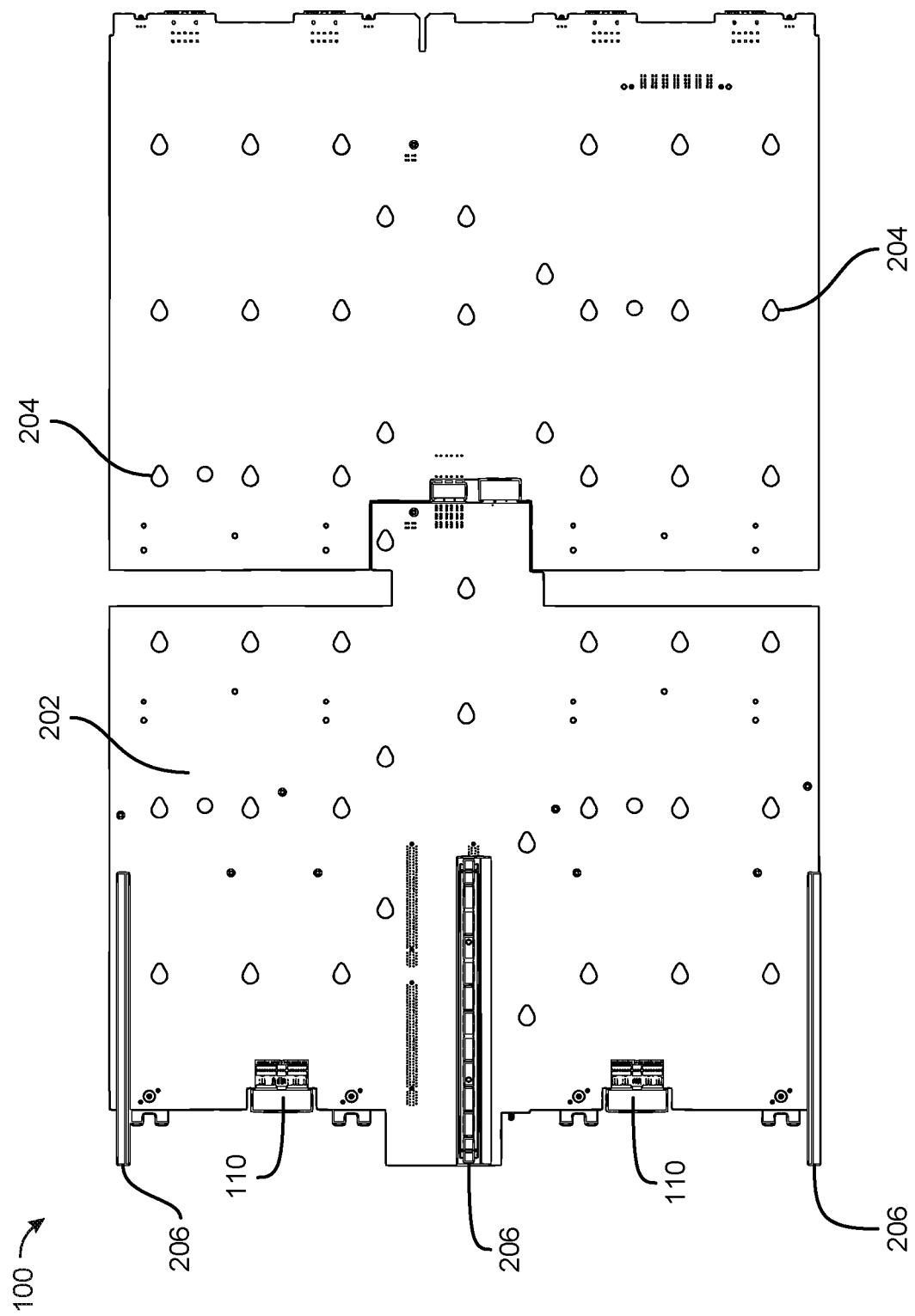
FIG. 2 is a bottom view of the exemplary passive drive-plane board illustrated in FIG. 1.
Figure 3:
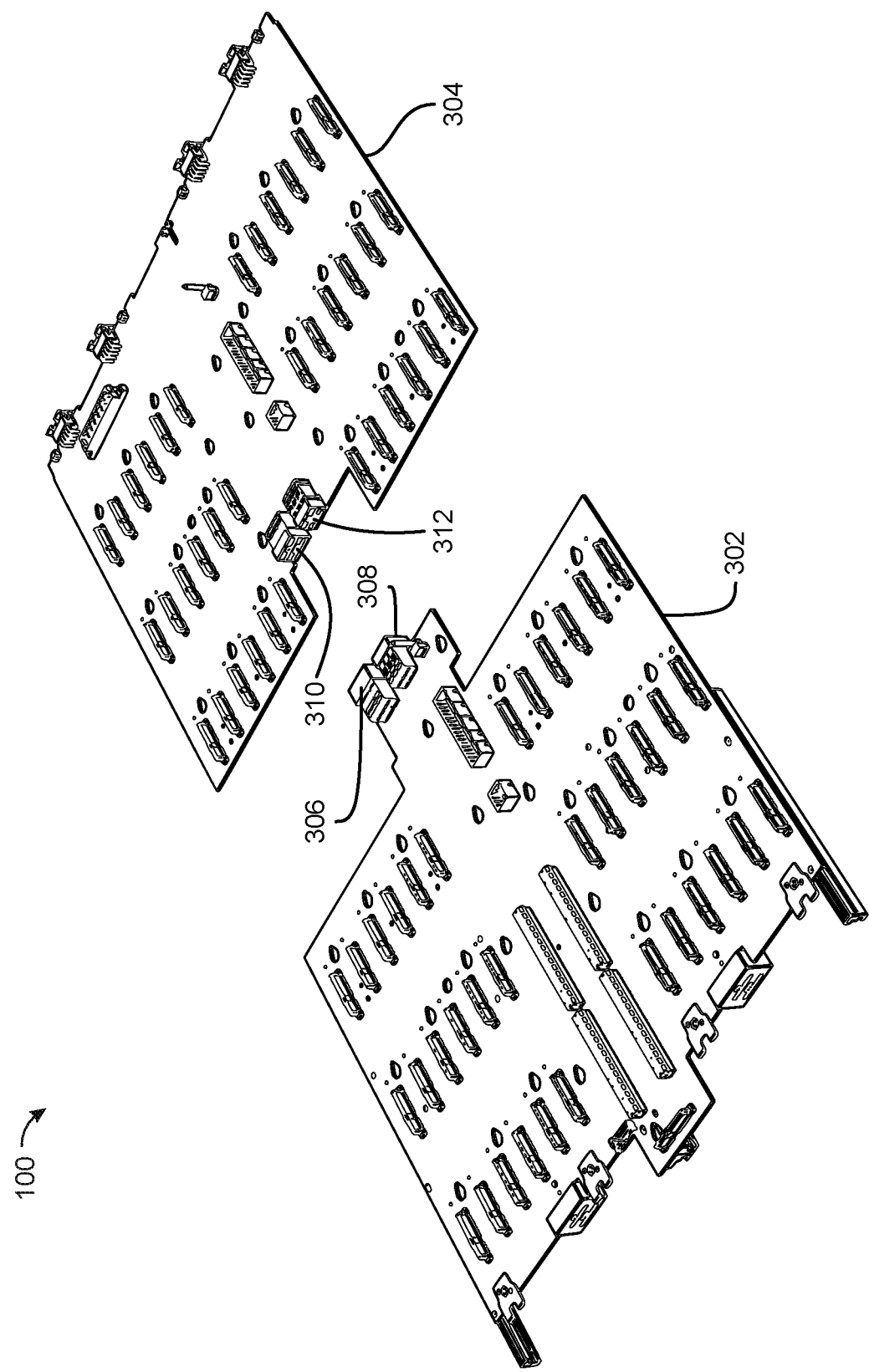
FIG. 3 is a perspective view of the exemplary passive drive-plane board illustrated in FIG. 1 in a disconnected state.

The following will provide, with reference to FIGS. 1-3, detailed descriptions of an example passive drive-plane board that enables a storage-system drawer to take on multiple different storage-system configurations. Detailed descriptions of example storage-system configurations will be provided in connection with FIGS. 4-9. In addition, detailed descriptions of an example storage-system drawer will be provided in connection with FIGS. 10-12. Detailed descriptions of an example method for reconfiguring a storage-system drawer will also be provided in connection with FIG. 13.

FIG. 1 shows a top view of an example passive drive-plane board 100. Passive drive-plane board 100 generally represents any structure that is adapted to passively connect the various active components (e.g., compute modules, storage drives, storage-controller modules, and input/output modules) that make up a storage system and/or secure the components within a chassis. In some examples, passive drive-plane board 100 may be one or more printed circuit boards (PCBs) that include various connectors that are electrically connected by conductive traces. Passive drive-plane board 100 may be configured to support any number of drives, fans, and other computing components, as needed. In one example, passive drive-plane board 100 may be configured to support up to 72 storage drives, up to four fans, drive power control, sensors (e.g., temperature sensors or drawer open sensors), and incoming power.

In some examples, passive drive-plane board 100 may be adapted to enable a storage-system chassis, such as a rack-mounted drawer, to take on several different storage-system configurations. As used herein, the term "storage-system configuration" generally refers to the forms and/or arrangements of the components that make up a storage system. Two storage-system configurations may be considered as different if they use different types, forms, or arrangements of components. In some examples, passive drive-plane board 100 may include some or all of the common components that are shared between a dual-server configuration 400 illustrated in FIG. 4, a single-server configuration 600 illustrated in FIG. 6, and/or a JBOD configuration 800 illustrated in FIG. 8.

As shown in FIG. 1, passive drive-plane board 100 may have a top 102 on which are mounted various types of connectors. In one non-limiting example, passive drive-plane board 100 may include 72 storage-drive connectors 104, two compute-module connectors 106, two storage-controller connectors 108, two I/O-module connectors 110, four fan module connectors 112, a front-panel connector 114, and a power connector 116. While not shown in FIG. 1, passive drive-plane board 100 may include electrical conductors that electrically connect some or all of the connectors shown in FIG. 1.

Each of storage-drive connectors 104 may be configured to interface with a single storage drive. The term "storage drive," as used herein, generally refers to any device capable of storing electronic data. In some examples, storage-drive connectors 104 may be configured to interface with solid state drives, hard disk drives, and/or optical drives. In some examples, storage-drive connectors 104 may be configured to interface with two or more different types of storage drives. For example, storage-drive connectors 104 may be configured to interface with storage drives that have different physical form factors, that are made up of different types of storage (e.g., solid state or hard disk), that use different protocols, and/or that use different types of connectors. In some examples, storage-drive connectors 104 may be configured to interface with serial attached small computer system interface (SAS) drives, serial advanced technology attachment (SATA) drives, and/or Non-Volatile Memory Express (NVMe) drives. In some examples, storage-drive connectors 104 may be configured to enable hot-swapping of storage drives.

Each of compute-module connectors 106 may be configured to interface with a compute module. The term "compute module," as used herein, generally refers to any server module whose primary function is computational and/or any server module whose primary function is to provide data storage services. In some examples, compute-module connectors 106 may be configured to interface with two or more different types of compute modules. Additionally or alternatively, passive drive-plane board 100 and compute-module connectors 106 may be collectively configured to allow one or both of compute-module connectors 106 to be left empty. In some examples, compute-module connectors 106 may be configured to enable hot-swapping of compute modules. In one non-limiting example, passive drive-plane board 100 and each of compute-module connectors 106 may be collectively configured to (1) connect a single compute module to a single storage-controller module that controls 36 storage drives in a storage-system drawer and (2) logically separate the compute module and the storage-controller module from other compute modules, storage-controller modules, and storage drives in the storage-system drawer.

Each of storage-controller connectors 108 may be configured to interface with a storage-controller module. The term "storage-controller module," as used herein, generally refers to any storage-system module whose primary function is to control and communicate with storage drives. In some examples, storage-controller connectors 108 may be configured to interface with two or more different types of storage-controller modules, such as those illustrated in FIGS. 4, 6, and 8. Each of storage-controller connectors 108 may be connected to one or more of storage-drive connectors 104 via SATA, SAS, and/or Peripheral Component Interconnect express (PCIe) connections and may be configured to host SATA, SAS, and/or PCIe storage-controller modules. In some examples, passive drive-plane board 100 may be configured such that each of storage-controller connectors 108 are connected to a different portion of storage-drive connectors 104. In addition, storage-controller connectors 108 may be configured to enable hot-swapping of storage-controller modules.

Each of I/O-module connectors 110 may be configured to interface with an I/O module. The term "I/O module," as used herein, generally refers to any storage-system module whose primary function is to facilitate data transfer in and out of a storage system. In some examples, I/O-module connectors 110 may be configured to interface with two or more different types of I/O modules, such as those illustrated in FIGS. 4 and 6. In some examples, I/O-module connectors 110 may be configured to enable hot-swapping of I/O modules.

Passive drive-plane board 100 may have additional elements other than those illustrated in FIG. 1. In some examples, as shown in FIG. 2, a bottom 202 of passive drive-plane board 100 may include keyholes 204 for attaching passive drive-plane board 100 to a storage-system chassis and rails 206 that are configured to secure an I/O-module drawer containing an I/O module. As illustrated in FIG. 3, passive drive-board 100 may be made up of one or more separable pieces. In the example shown, passive drive-board 100 may include a front PCB 302 and a rear PCB 304 that may be electrically coupled via high-speed connectors 306-312. In some examples, high-speed connectors 306-312 may provide power and communication pathways between the components of front PCB 302 and the components of rear PCB 304.

Figure 4:
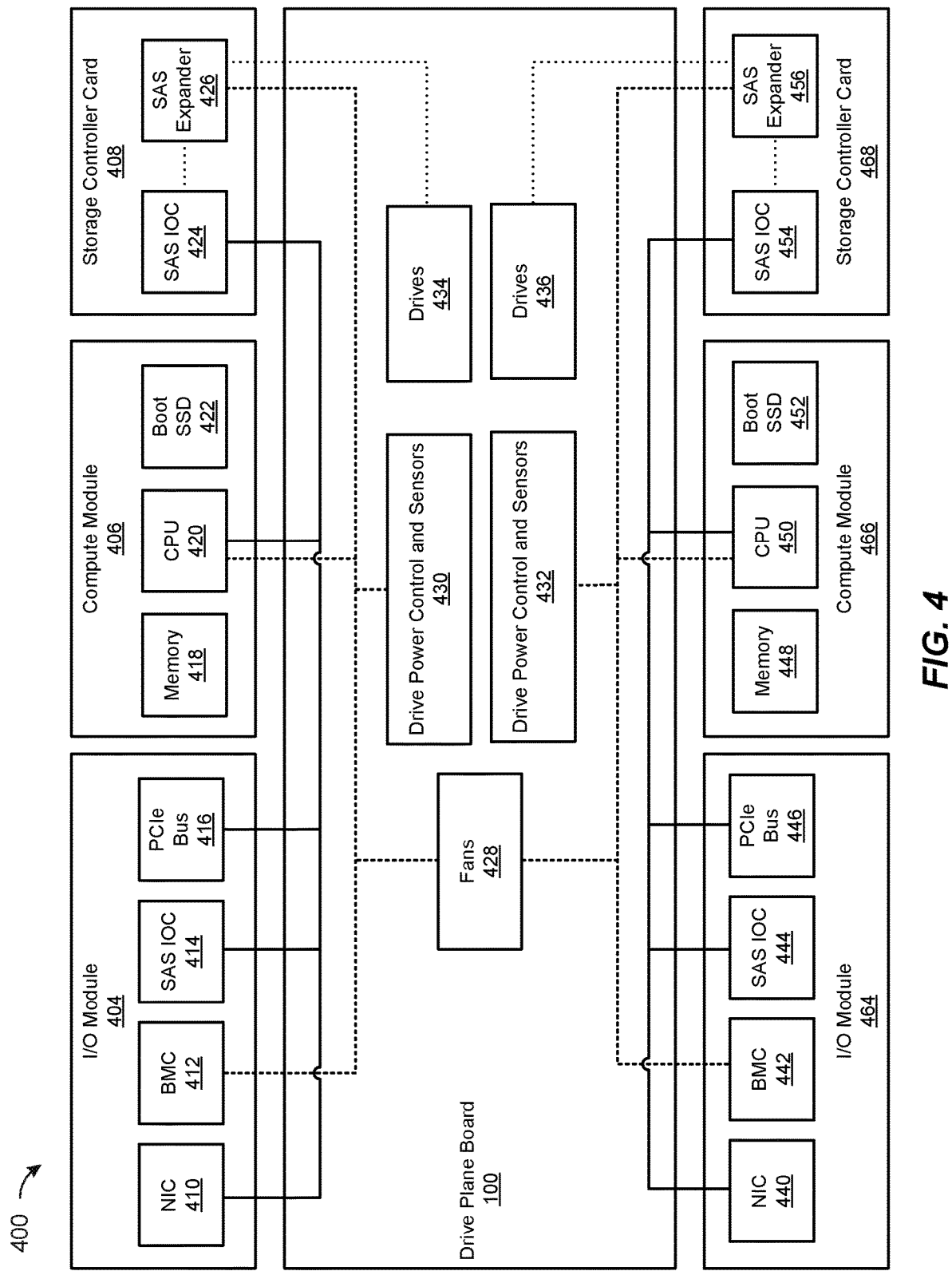
FIG. 4 is a block diagram of an exemplary dual-server configuration.
Figure 5:
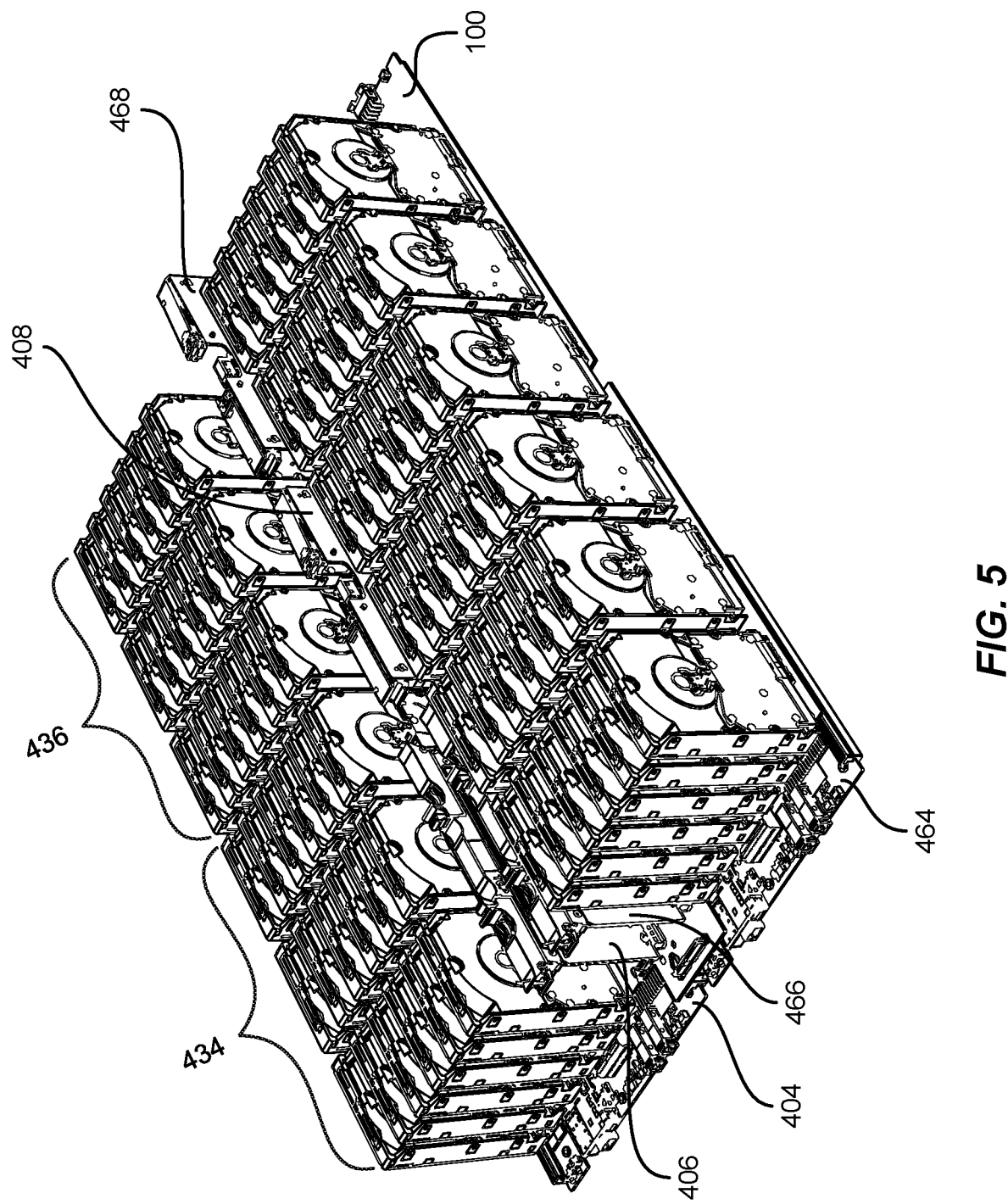
FIG. 5 is a partial perspective view of an exemplary storage-system drawer having the exemplary dual-server configuration illustrated in FIG. 4.

FIGS. 4 and 5 show a block diagram of a dual-server configuration 400 and a partial perspective view of a storage-system drawer having dual-server configuration 400, respectively. As illustrated in FIG. 4, passive drive-plane board 100 may be connected to one or more fans 428, drive power control and sensors 430 and/or 432, and/or drives 434 and/or 436. In some embodiments, drive power control and sensors 430 and/or 432 may monitor the state of the storage-system drawer and/or devices housed within its chassis, such as whether the storage-system drawer is open and/or the temperature of the storage-system drawer and/or its components. In some embodiments, drives 434 may be connected to PCB 302, and/or drives 436 may be connected to PCB 304. In one non-limiting example, drives 434 and/or 436 may each represent 36 SAS drives or 36 SATA drives, for a total of 72 drives in the storage-system drawer. In one embodiment, an I/O module 404 may include a Network Interface Controller (NIC) 410, a Baseboard Management Controller (BMC) 412, a SAS Input/Output Controller (IOC) 414, and/or a PCIe bus 416. In one embodiment, a compute module 406 may include memory 418, a Central Processing Unit (CPU) 420, and/or a boot Solid State Drive (SSD) 422. In some embodiments, compute module 406 may be an OPEN COMPUTE PROJECT (OCP) microserver. In some embodiments, a storage controller card 408 may include a SAS IOC 424 and/or a SAS expander 426.

In some embodiments, NIC 410, SAS IOC 414, CPU 420, and/or SAS IOC 424 may all be connected to PCIE bus 416 via PCIe connectors and electrical interconnects contained within passive drive-plane board 100. In one embodiment, BMC 412, CPU 420, and/or drive power control and sensors 430 may be connected to SAS expander 426 via electrical interconnects contained within passive drive-plane board 100. In some embodiments, BMC 412, CPU 420, and/or drive power control and sensors 430 may be connected to SAS expander 426 via eight lanes of PCIe generation 3 connectors contained within passive drive-plane board 100. In some embodiments, SAS IOC 424 may be connected to SAS expander 426 via a SAS connection. For example, SAS IOC 424 may be connected to SAS expander 426 via eight lanes of twelve gigabyte SAS connections. In some embodiments, SAS expander 426 may be connected to drives 434 via a SATA connection contained within passive drive-plane board 100. In other embodiments, SAS expander 426 may be connected to drives 434 via a SAS connection contained within passive drive-plane board 100. For example, SAS expander 426 may be connected to drives 434 via thirty-six lanes of twelve gigabyte SAS connections contained within passive drive-plane board 100 and/or six gigabyte SATA connections contained within passive drive-plane board 100.

Similarly, an I/O module 464 may include an NIC 440, BMC 442, SAS IOC 444, and/or PCIe bus 446; a compute module 466 may include memory 448, a CPU 450, and/or a boot SSD 452; and/or a storage controller card 468 may include a SAS IOC 454 and/or a SAS expander 456. The aforementioned components may be connected to one another and to the components on passive drive-plane board 100 in a similar manner to the components hosted within I/O module 404, compute module 406, and/or storage controller card 408. In one embodiment, the only external connection between the storage-system drawer and other systems may be an Ethernet link. In at least one example, SAS IOC 414 may not be populated on I/O module 404 since drives 434 may be directly connected, and/or SAS IOC 444 may not be populated on I/O module 464 since drives 436 may be directly connected. In this example, SAS IOC 424 on storage controller card 408 may be used to connect to SAS expander 426, which attaches drives 434, and/or SAS IOC 454 on storage controller card 468 may be used to connect to SAS expander 456, which attaches drives 436.

In some examples, BMC 412 and BMC 442 may handle the majority of storage-system management in the storage-system drawer. For example, BMC 412 may manage compute module 406, storage controller card 408, drives 434, fans 428, and drive power control and sensors 430. Similarly, BMC 442 may manage compute module 466, storage controller card 468, drives 436, fans 428, and drive power control and sensors 432. Additionally, SAS Expanders 426 and 456 may handle communication with individual drives as well as monitor certain sensors.

Figure 6:
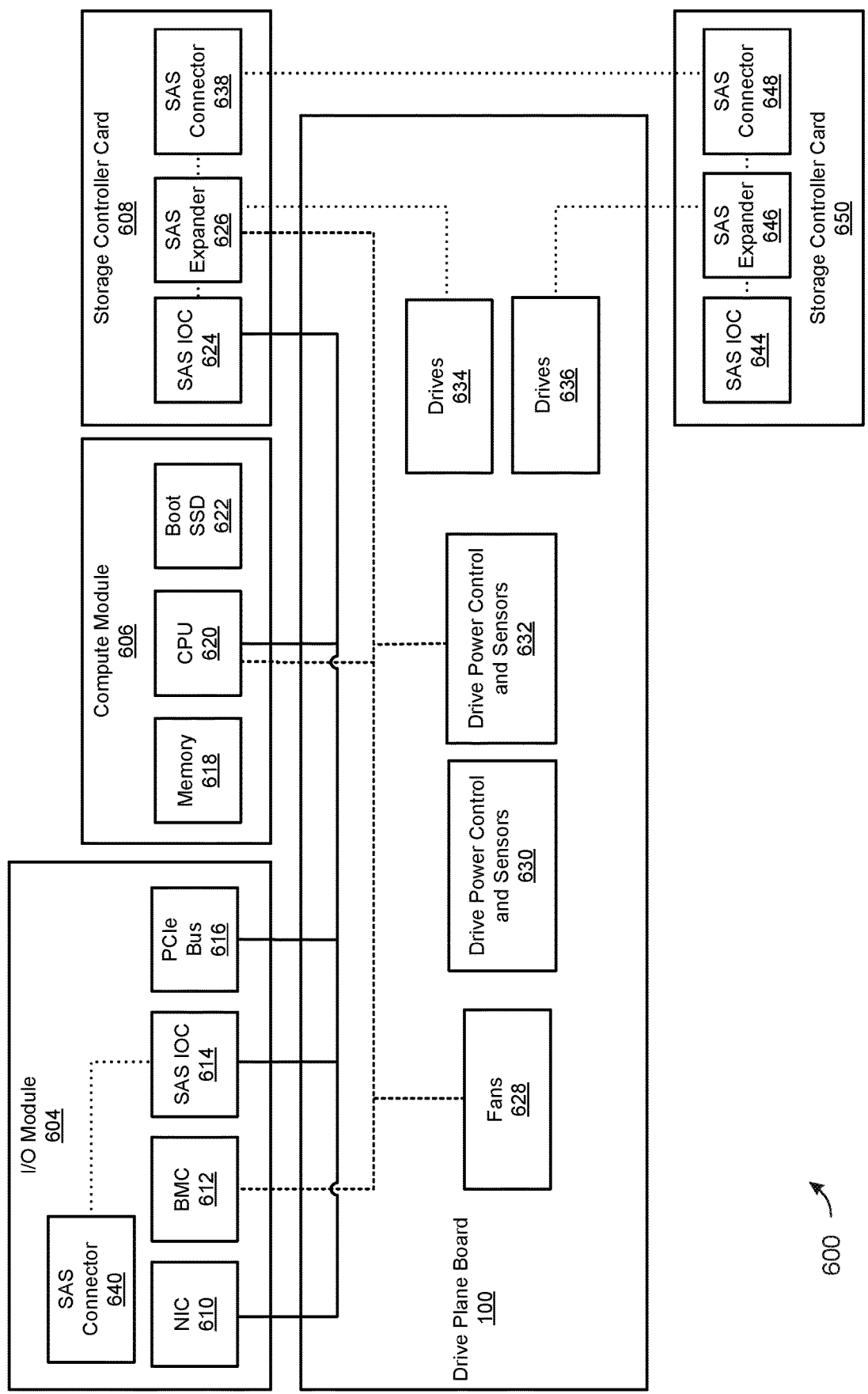
FIG. 6 is a block diagram of an exemplary single-server configuration.
Figure 7:
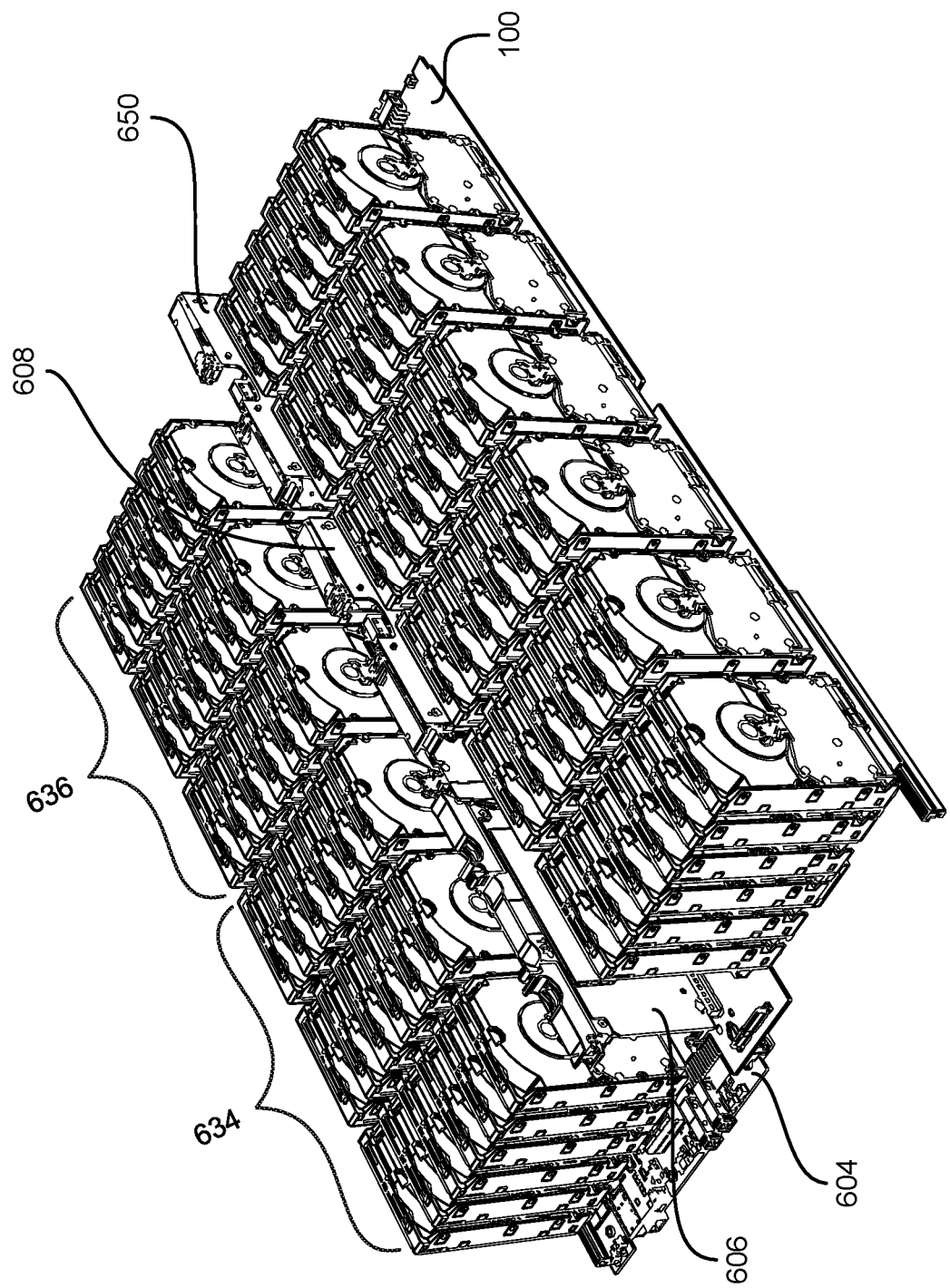
FIG. 7 is a partial perspective view of an exemplary storage-system drawer having the exemplary single-server configuration illustrated in FIG. 6.

FIGS. 6 and 7 show a block diagram of a single-server configuration 600 and a partial perspective view of a storage-system drawer having single-server configuration 600, respectively. In some embodiments, a single-server configuration may be intended for applications that use a lower compute-to-storage ratio compared to applications that operate efficiently when hosted by a dual-server configuration (illustrated in FIGS. 4 and 5). In some embodiments, a single-server drawer may serve as a head node for a cold-storage system that includes multiple servers storing data that does not need to be frequently accessed and may be connected to one or more JBOD drawers connected downstream to increase the number of storage drives behind the head node.

As illustrated in FIG. 6, passive drive-plane board 100 may be connected to fans 628, drive power control and sensors 630, drive power control and sensors 632, drives 634, and/or drives 636. In some embodiments, drives 634 may be connected to PCB 302, and/or drives 636 may be connected to PCB 304. In some examples, drives 634 and/or 636 may each represent 36 SAS and/or SATA drives, for a total of 72 storage drives in the storage-system drawer. In one embodiment, an I/O module 604 may include a SAS connector 640, an NIC 610, a BMC 612, a SAS IOC 614, and/or a PCIe bus 616. In some embodiments, a compute module 606 may include memory 618, a CPU 620, and/or a boot SSD 622. In some embodiments, a storage controller card 608 may include a SAS IOC 624, a SAS expander 626, and/or a SAS connector 638. In one embodiment, a storage controller card 650 may include a SAS IOC 644, a SAS expander 646, and/or a SAS connector 648.

In some embodiments, NIC 610, SAS IOC 614, CPU 620, and/or SAS IOC 624 may all be connected to PCIE bus 616 via PCIe connectors and electrical interconnects contained within passive drive-plane board 100. In some embodiments, SAS connector 640 may be connected to SAS IOC 614 via a SAS connection. For example, SAS connector 640 may be connected to SAS IOC 614 via six lanes of twelve gigabyte SAS connections. In one embodiment, BMC 612, fans 628, drive power control and sensors 632, and/or SAS expander 626 may all be connected to CPU 620 via connections contained within passive drive-plane board 100. In some embodiments, SAS expander 626 may be connected to SAS IOC 624, drives 634, and/or SAS connector 638. In some examples, SAS expander 626 may be connected to SAS IOC 624 and/or SAS connector 638 via 6 gigabyte SAS connections. Additionally, SAS expander 626 may be connected to drives 634 via 6 gigabyte SAS connections contained within passive drive-plane board 100. In one example, SAS expander 626 may be connected to SAS IOC 624 via eight lanes of SAS connections, to SAS connector 638 via four lanes, and/or to drives 634 via thirty-six lanes. Similarly, SAS expander 646 may be connected to SAS IOC 644, drives 636, and/or SAS connector 648. In some embodiments, SAS connector 638 may be connected to SAS connector 648 via a connection path not contained within passive drive-plane board 100. In some examples, internal MiniSAS connectors of storage controller card 608 and storage controller card 650 may be connected via an x4 cable to connect drives 634 and 636.

In some examples, BMC 612 may handle the majority of storage-system management in the storage-system drawer. For example, BMC 612 may manage compute module 606, storage controller card 608, drives 634, fans 628, and drive power control and sensors 632. In some examples, storage controller card 650 may manage drives 636, fans 628, and drive power control and sensors 630. Additionally, SAS Expanders 626 and 646 may handle communication with individual drives as well as monitor certain sensors.

Figure 8:
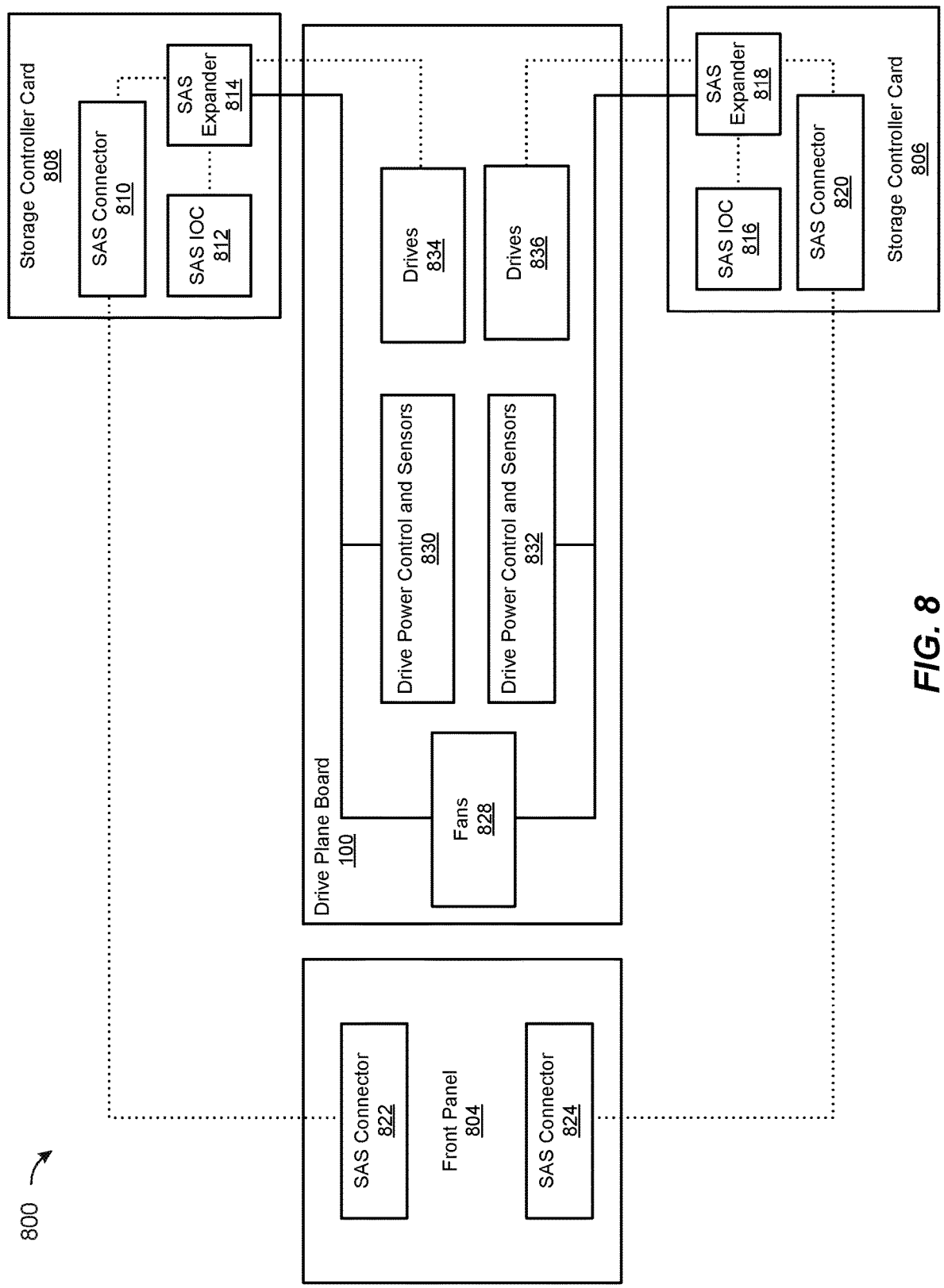
FIG. 8 is a block diagram of an exemplary JBOD configuration.
Figure 9:
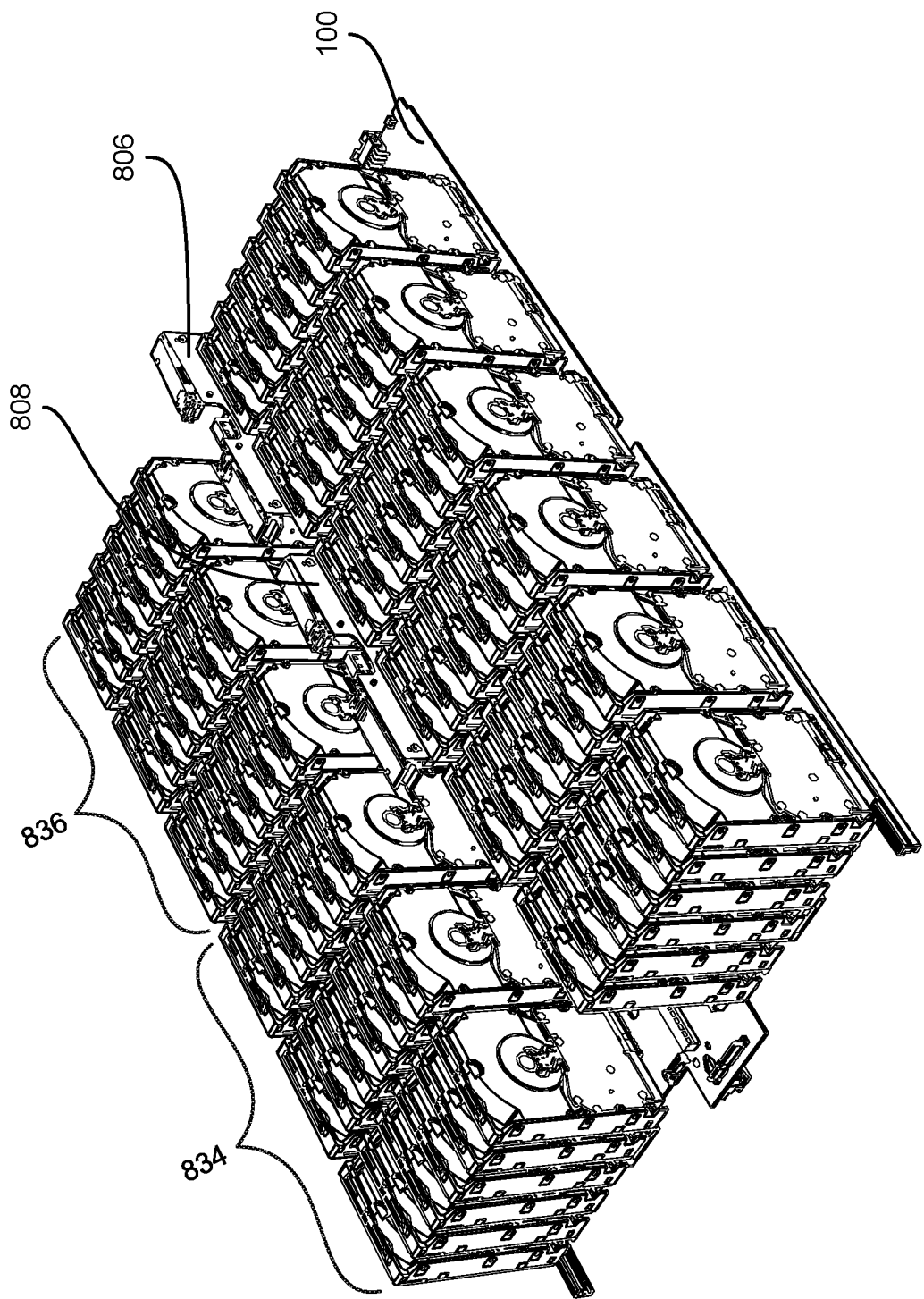
FIG. 9 is a partial perspective view of an exemplary storage-system drawer having the exemplary JBOD configuration illustrated in FIG. 8.

FIGS. 8 and 9 show a block diagram of an exemplary JBOD configuration 800 and a perspective view of the storage-system drawer having JBOD configuration 800, respectively. In some embodiments, an external compute module (like those illustrated in FIGS. 4-7) may be connected to the storage-system drawer when the storage-system drawer is configured as a JBOD drawer. For example, an external compute module may be connected to the storage-system drawer via a SAS connector exposed at the front of the storage-system drawer. In one embodiment, passive drive-plane board 100 may be connected to fans 828, drive power control and sensors 830 and/or 832, and/or drives 834 and/or 836. In some embodiments, drives 834 may be connected to PCB 302, and/or drives 836 may be connected to PCB 304. In some examples, drives 834 and/or 836 may each represent 36 SAS and/or SATA drives, for a total of 72 drives in the storage-system drawer. In one embodiment, a front panel 804 may include a SAS connector 822 and/or a SAS connector 824. In some embodiments, a storage controller card 808 may host a SAS connector 810, a SAS IOC 812, and/or a SAS expander 814. Similarly, a storage controller card 806 may include a SAS connector 820, a SAS IOC 816, and/or a SAS expander 818.

In some embodiments, SAS expander 814 and/or SAS expander 818 may be connected to and/or control fans 828 via electrical interconnects contained within passive drive-plane board 100. In one embodiment, SAS expander 814 may be connected to drive power control and sensors 830 via electrical interconnects contained within passive drive-plane board 100. Similarly, SAS expander 818 may be connected to drive power control and sensors 832 via electrical interconnects contained within passive drive-plane board 100. In one embodiment, SAS expander 814 may be connected to SAS connector 810, SAS IOC 812, SAS connector 822, and/or drives 834. In one example, SAS expander 814 may be connected to drives 834 via electrical interconnects contained within passive drive-plane board 100. In some examples, SAS expander 814 may be connected to SAS connector 810 via four lanes of twelve gigabyte SAS connections, may be connected to SAS IOC 812 via eight lanes of twelve gigabyte SAS connections, may be connected to SAS connector 822 via a four lane miniSAS high-density (HD) internal cable, and/or may be connected to drives 834 via thirty-six lanes of twelve gigabyte SAS connections. In some embodiments, SAS expander 818 may be connected to SAS connector 820, SAS IOC 816, SAS connector 824, and/or drives 836 in a similar fashion. In some examples, SAS IOC 812 and/or SAS IOC 816 may not be populated. In some embodiments, multiple JBOD servers may be used as nodes behind a head node that is configured as a single-server drawer and/or a JBOD-server drawer. In some examples, storage controller cards 806 and 808 may handle the majority of storage-system management in the storage-system drawer. For example, storage controller card 808 may manage drives 834, fans 828, and drive power control and sensors 830. Similarly, storage controller card 806 may manage drives 836, fans 828, and drive power control and sensors 832.

Figure 10:
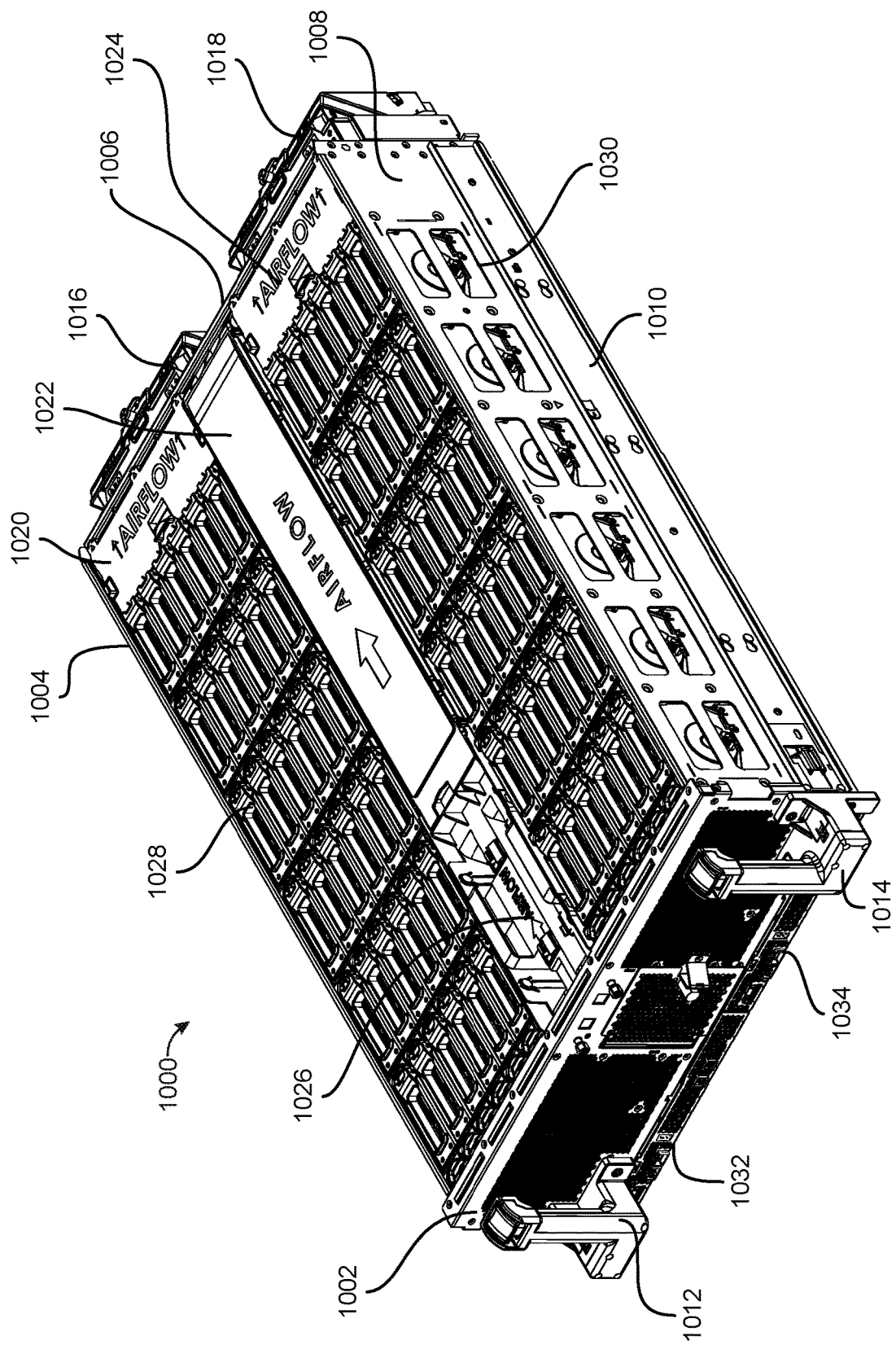
FIG. 10 is a perspective view of an exemplary storage-system drawer.
Figure 11:
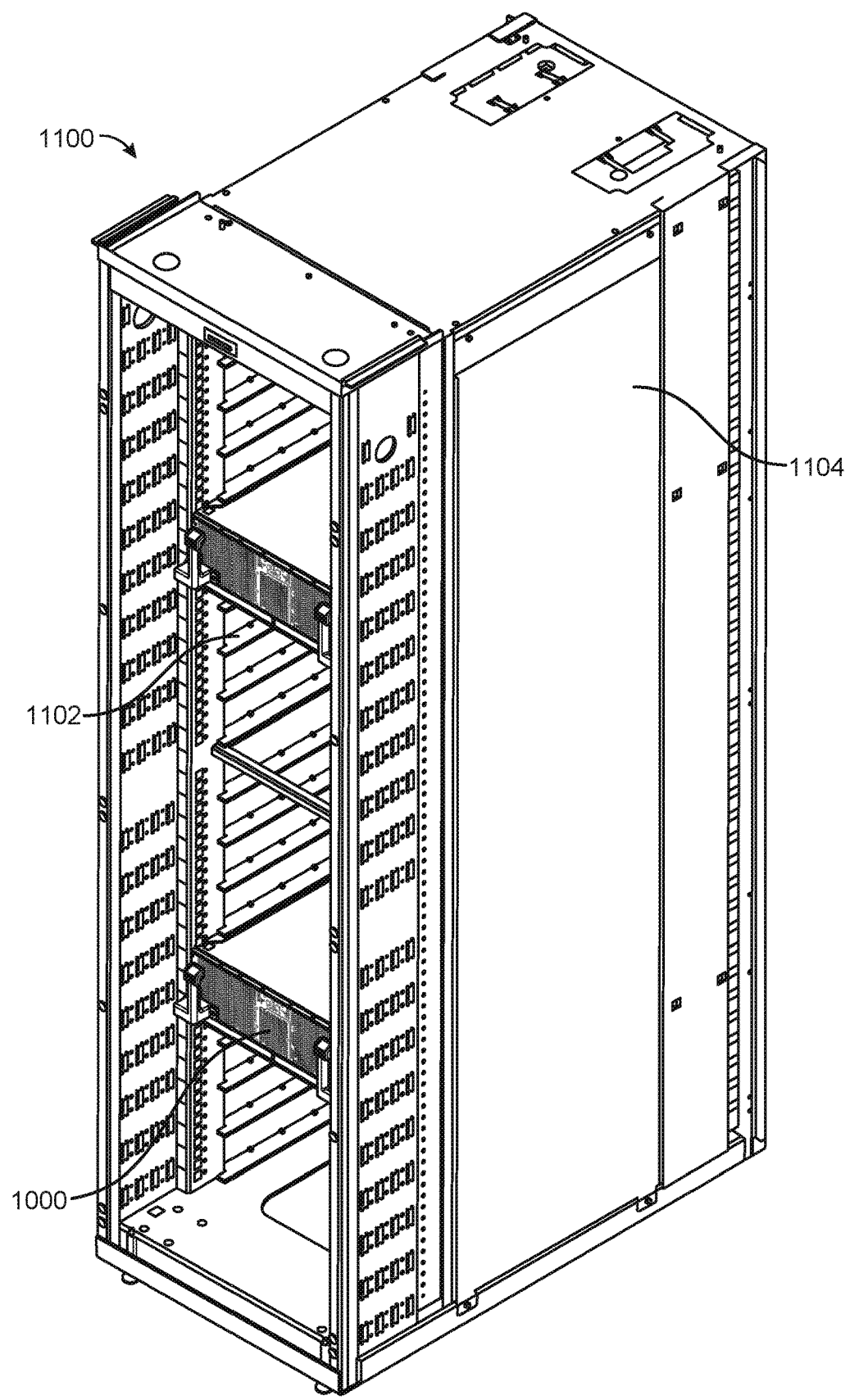
FIG. 11 is a perspective view of an exemplary data-center rack with several storage-system drawers.

FIG. 10 shows a perspective view of a storage-system drawer 1000. The term "storage-system drawer," as used herein, generally refers to any structure that is adapted to house the various components that make up a storage system. As illustrated in FIG. 10, storage-system drawer 1000 may include a chassis (e.g., a metallic enclosure) made up of a front 1002, a left side 1004, a rear 1006, and a right side 1008. The chassis of storage-system drawer 1000 may be adapted to be housed in a data-center rack 1100 as illustrated in FIG. 11. In one example, storage-system drawer 1000 may be positioned on a support tray (such as support tray 1102) coupled to a frame 1104 of data-center rack 1100. As used herein, the term "data-center rack" generally refers to any multi-system chassis structure for housing multiple storage-system drawers and chassis and/or providing support for one or more cables that connect to the storage-system drawers and chassis. In some examples, a single data-center rack may contain a homogeneous set of storage-system drawers. For example, a single data-center rack may contain multiple storage-system drawers that have the same single-server configuration, the same dual-server configuration, and/or the same JBOD configuration. Alternatively, a single data-center rack may contain a heterogeneous set of storage-system drawers. For example, a single data-center rack may contain two or more of a single-server storage-system drawer that has a single-server configuration, a dual-server storage-system drawer that has a dual-server configuration, and/or a storage-system drawer that has a JBOD configuration. In some examples, a data-center rack may also contain power supplies, network switches, and/or battery backup units.

Returning to FIG. 10, storage-system drawer 1000 may include slide mechanisms (e.g., drawer-slide mechanism 1010) that are coupled to left side 1004 and right side 1008 and enable storage-system drawer 1000 to be fully extended out of data-center rack 1100 for servicing. In at least one example, these slide mechanisms may include various dampening components configured to reduce the amount of shock applied to the components contained within storage-system drawer 1000 when storage-system drawer 1000 is opened/closed with force. These dampening components may be configured to dampen the movement of storage-system drawer 1000 when storage-system drawer 1000 is fully extended from data-center rack 1100 or fully inserted into data-center rack 1100. As shown, storage-system drawer 1000 may include pull-handle 1012 and pull-handle 1014 configured to enable a technician to easily pull storage-system drawer 1000 out from and return storage-system drawer 1000 to data-center rack 1100.

In some examples, the chassis of storage-system drawer 1000 may be sized to house all of the storage-system components illustrated in FIGS. 5, 7, and 9. As shown in FIG. 10, storage-system drawer 1000 may be configured so that most of the storage-system components that are contained within storage-system drawer 1000 may be serviced through the top side of storage-system drawer 1000. For example, each storage drive contained in storage-system drawer 1000 may be secured within storage-system drawer 1000 via a latch (e.g., a latch 128) adapted to hold the storage drive in place when closed and enable removal of the storage drive when open. In some embodiments, storage-system drawer 1000 may include one or more removable covers (e.g., removable covers 1022 and 1026) that cover and provide access to other components contained within storage-system drawer 1000, such as a compute module, a storage-controller card, and/or cables.

Figure 12:
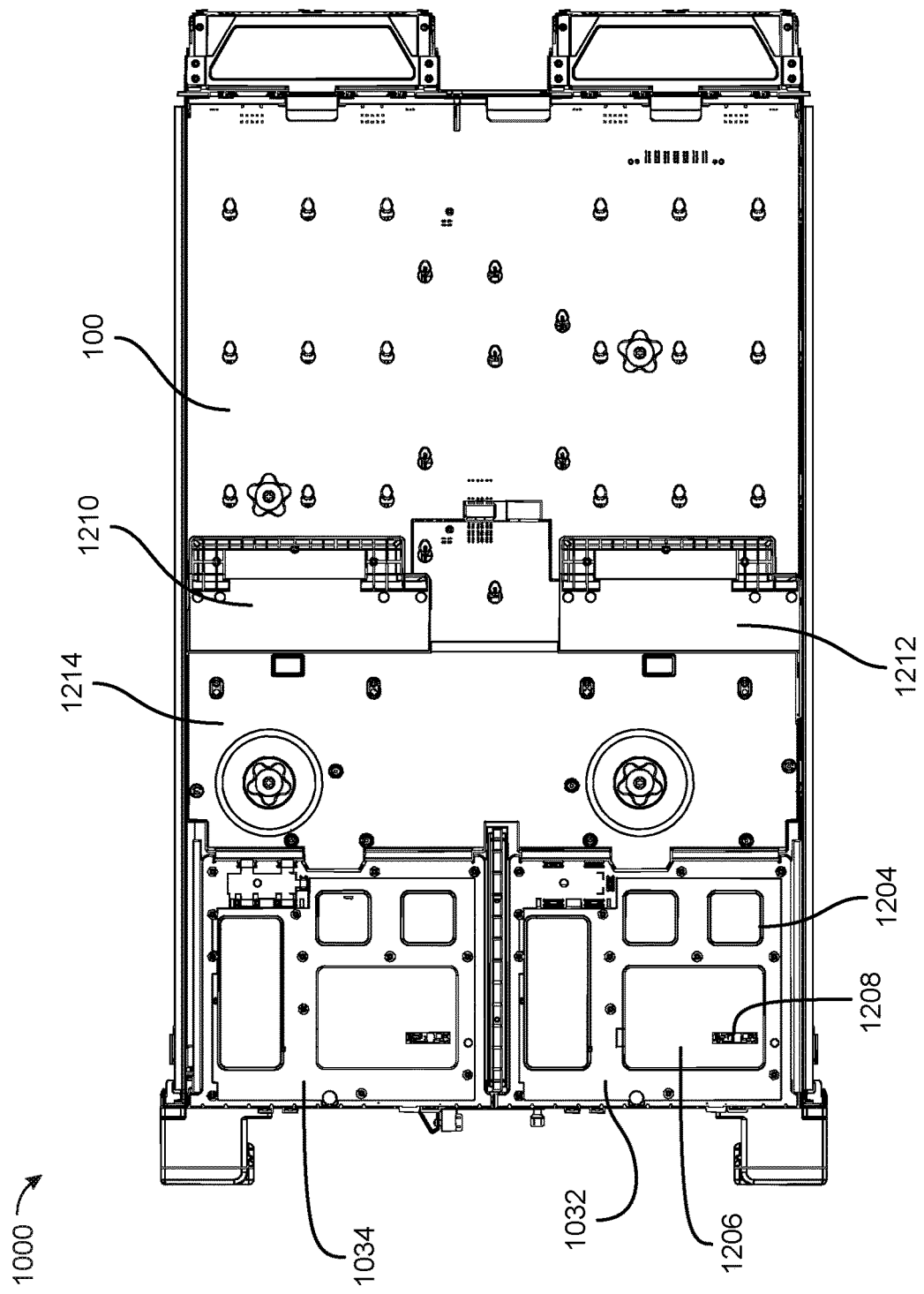

Additionally or alternatively, storage-system drawer 1000 may be configured so that some of the storage-system components that are contained within storage-system drawer 1000 may be serviced through the front, the bottom, or the rear of storage-system drawer 1000. For example, storage-system drawer 1000 may include front-accessible I/O-module drawers, such as I/O-module drawers 1032 and 1034, that are adapted to secure I/O modules within storage-system drawer 1000. As shown in FIG. 12, I/O-module drawers 1032 and 1034 may include various holes and openings (e.g., opening 1204) in order to reduce the weight of storage-system drawer 1000. In these examples, light-weight films (e.g., film 1206) may be used to cover the holes and openings in the I/O-module drawers in order to prevent air from passing through the holes and openings. In at least one example, these light-weight films may include their own holes or openings (e.g., opening 1208) that are located to allow air to enter an I/O-module drawer and to cool adjacent I/O module components, such as heatsinks.

As shown in FIG. 10, storage-system drawer 1000 may include a fan module 1016 and a fan module 1018 removably attached to rear 1006. In some examples, fan module 1016 and fan module 1018 may include one or more fans that pull an airflow rearward through the chassis of storage-system drawer 1000 for the purpose of cooling the storage-system components housed within storage-system drawer 1000. In order to retain the airflow and create plenum within its chassis, storage-system drawer 1000 may include one or more airflow-retaining mechanisms such as a removable baffle 1020, removable cover 1022, a removable baffle 1024, and removable cover 1026. In some examples, the storage-drive latches contained within storage-system drawer 1000 (e.g., latch 1028) may include a clear film that creates plenum and enables a technician to view an enclosed storage drive when the latch is closed. In some examples, the sides of storage-system drawer 1000 may include various holes and openings (e.g., opening 1030) in order to reduce the weight of storage-system drawer 1000. In these examples, light-weight films (e.g., mylar films) may be used to cover the holes and openings in order to prevent air from passing through the sides of storage-system drawer 1000. As shown in FIG. 12, storage-system drawer 1000 may also include passive drive-plane board 100, a baffle 1210, a baffle 1212, and a baffle 1214 that may also be sized and configured to retain the airflows generated by fan modules 1016 and 1018 within storage-system drawer 1000. In some examples, passive drive-plane board 100 may be accessed and/or removed from storage-system drawer 1000 from the bottom of storage-system for 1000. In some examples, the various airflow-retaining mechanisms of storage-system drawer 1000 may enable storage-system drawer 1000 to be pulled out of a data-center rack for an extended period of time. In some configurations, the various airflow-retaining mechanisms of storage-system drawer 1000 may enable a service time of greater than 10 minutes.

Figure 13:
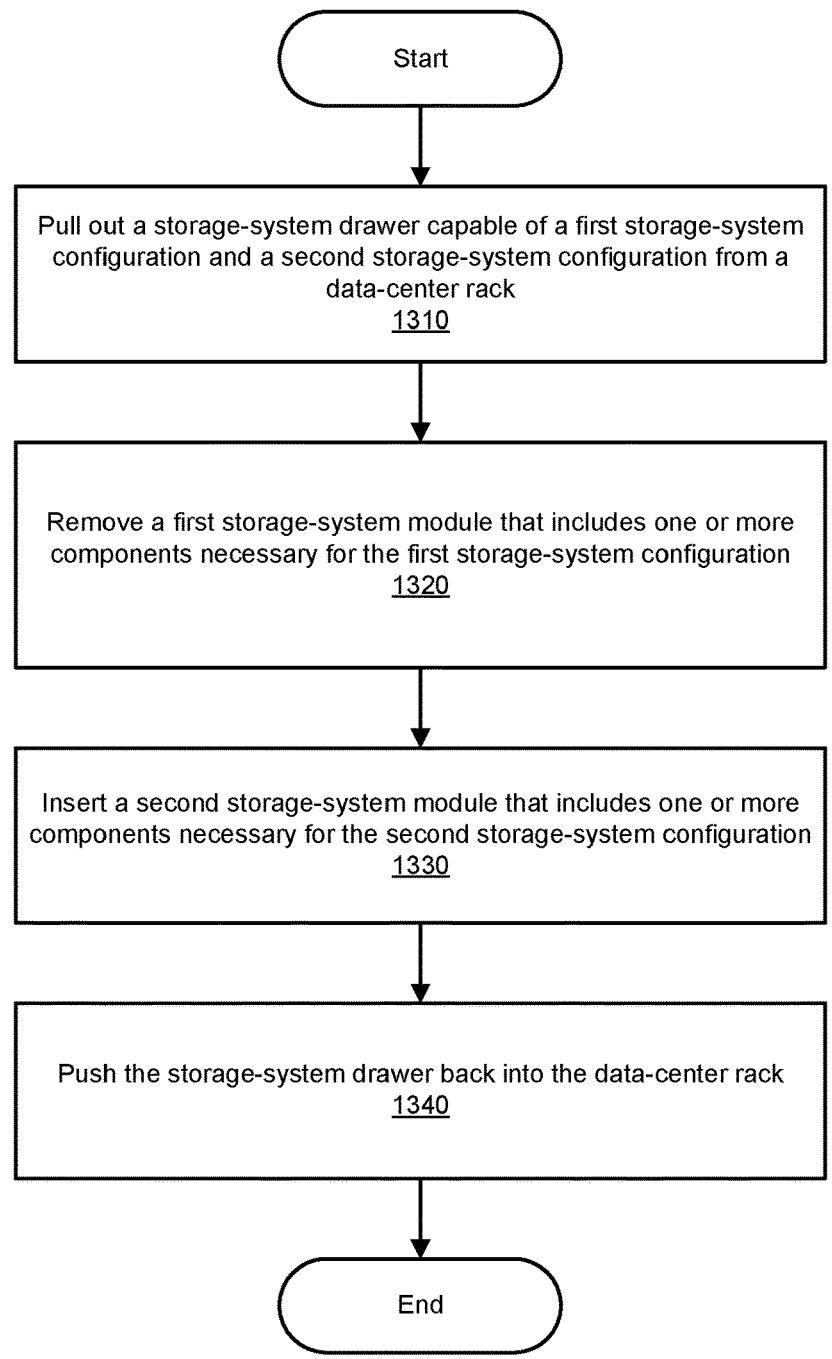
FIG. 13 is a flow diagram of an exemplary method for reconfiguring storage-system drawers.

FIG. 13 illustrates a flow diagram of a method 1300 for reconfiguring storage-system drawers. As shown in FIG. 13, at step 1310, a storage-system drawer capable of a first storage-system configuration and a second storage-system configuration may be pulled out from a data-center rack. Using FIG. 11 as an example, storage-system drawer 1000 may be pulled out from data-center rack 1100.

As step 1320, a first storage-system module that includes one or more components necessary for the first storage-system configuration may be removed from the storage-system drawer. For example, when reconfiguring storage-system drawer 1000 from configuration 400 to configuration 600 or configuration 800, one or more of I/O module 404, compute module 406, storage controller card 408, I/O module 464, compute module 466, and storage controller card 468 may be removed from storage-system drawer 1000. Similarly, when reconfiguring storage-system drawer 1000 from configuration 600 to configuration 400 or configuration 800, one or more of I/O module 604, compute module 606, storage controller card 608, and storage controller card 650 may be removed from storage-system drawer 1000. Likewise, when reconfiguring storage-system drawer 1000 from configuration 800 to configuration 400 or configuration 600, storage controller card 808 and storage controller card 806 may be removed from storage-system drawer 1000.

As step 1330, a second storage-system module that includes one or more components necessary for the second storage-system configuration may be inserted into the storage-system drawer. For example, when reconfiguring storage-system drawer 1000 to configuration 400 from configuration 600 or configuration 800, one or more of I/O module 404, compute module 406, storage controller card 408, I/O module 464, compute module 466, and storage controller card 468 may be inserted into storage-system drawer 1000. Similarly, when reconfiguring storage-system drawer 1000 to configuration 600 from configuration 400 or configuration 800, one or more of I/O module 604, compute module 606, storage controller card 608, and storage controller card 650 may be inserted into storage-system drawer 1000. Likewise, when reconfiguring storage-system drawer 1000 to configuration 800 from configuration 400 or configuration 600, storage controller card 808 and storage controller card 806 may be inserted into storage-system drawer 1000.

As step 1340, the storage-system drawer may be pushed back into the data-center rack. Using FIG. 11 as an example, storage-system drawer 1000 may be pushed back into data-center rack 1100.

As explained above, by including some or all of the common components shared between two or more possible configurations of a storage system in a passive drive-plane board and modularizing the components that differ, the apparatus, systems, and methods disclosed herein may enable a storage-system drawer that contains the passive drive-plane board to take on any one of the configurations and/or be later reconfigured to take on any of the others. In some examples, the passive drive-plane board may include various connectors and electrical interconnects configured to mechanically and electrically couple various types of modularized components, such as compute modules, storage drives, storage controllers, input/output modules, auxiliary components, and other active storage-system components. In some examples, the passive drive-plane board may be protocol and/or connector agnostic to enable different forms of each type of modularized component to be mixed and matched.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A configurable storage-system drawer comprising:
   a chassis;
   a passive drive-plane board comprising:
      first storage-drive connectors;
      a first storage-controller-module connector configured to detachably mate with two or more of a first type of storage-controller module, a second type of storage-controller module, and a third type of storage-controller module, wherein:
         the first type of storage-controller module comprises one or more storage-controller components necessary for a single-server configuration;
         the second type of storage-controller module comprises one or more storage-controller components necessary for a dual-server configuration; and
         the third type of storage-controller module comprises one or more storage-controller components necessary for a just-a-bunch-of-drives configuration;
      first electrical interconnects that electrically couple the first storage-drive connectors to the first storage-controller-module connector;

second storage-drive connectors;
a second storage-controller-module connector configured to detachably mate with the first type, the second type, and the third type of storage-controller modules;
second electrical interconnects that electrically couple the second storage-drive connectors to the second storage-controller-module connector.

2. The configurable storage-system drawer of claim 1, wherein the passive drive-plane board further comprises:
a first compute-module connector configured to detachably mate with a first compute module comprising a first central processing unit;
third electrical interconnects that electrically couple the first compute-module connector to the first storage-controller-module connector;
a second compute-module connector configured to detachably mate with a second compute module comprising a second central processing unit; and
fourth electrical interconnects that electrically couple the second compute-module connector to the second storage-controller-module connector.

3. The configurable storage-system drawer of claim 2, further comprising:
first storage drives mated to the first storage-drive connectors;
second storage drives mated to the second storage-drive connectors;
the first compute module mated to the first compute-module connector;
a first storage-controller module of the first type mated to the first storage-controller-module connector, the first storage-controller module comprising:
a first input/output controller electrically coupled to the compute module via the third electrical interconnects;
a first expander electrically coupled to the first storage drives via the first electrical interconnects; and
a first connector electrically coupled to a second connector of a second storage-controller module of the first type via a cable; and
the second storage-controller module mated to the second storage-controller-module connector, the second storage-controller module comprising:
a second input/output controller electrically decoupled from any compute module via the fourth electrical interconnects;
a second expander electrically coupled to the second storage drives via the second electrical interconnects; and
the second connector electrically coupled to the first connector of the first storage-controller module via the cable.

4. The configurable storage-system drawer of claim 3, wherein:
the first and second input/output controllers are serial-attached small-computer-system-interface controllers;
the first and second expanders are serial-attached small-computer-system-interface expanders; and
the first and second connectors are serial-attached small-computer-system-interface ports.

5. The configurable storage-system drawer of claim 3, wherein:
the passive drive-plane board further comprises:
an input/output-module connector configured to accept an input/output module; and
fifth electrical interconnects that electrically couple the first compute-module connector to the input/output-module connector;
the configurable storage-system drawer further comprises the input/output module; and
the input/output module comprises:
a third connector accessible via a front of the chassis;
a third input/output controller electrically coupled to the third connector.

6. The configurable storage-system drawer of claim 2, further comprising:
first storage drives mated to the first storage-drive connectors;
second storage drives mated to the second storage-drive connectors;
the first compute module mated to the first compute-module connector;
the second compute module mated to the second compute-module connector;
a first storage-controller module of the second type mated to the first storage-controller-module connector, the first storage-controller module comprising:
a first input/output controller electrically coupled to the first compute module via the third electrical interconnects; and
a first expander electrically coupled to the first storage drives via the first electrical interconnects; and
a second storage-controller module of the second type mated to the second storage-controller-module connector, the second storage-controller module comprising:
a second input/output controller electrically coupled to the second compute module via the fourth electrical interconnects; and
a second expander electrically coupled to the second storage drives via the second electrical interconnects.

7. The configurable storage-system drawer of claim 5, wherein:
the first and second input/output controllers are serial-attached small-computer-system-interface controllers; and
the first and second expanders are serial-attached small-computer-system-interface expanders.

8. The configurable storage-system drawer of claim 6, wherein:
the passive drive-plane board further comprises:
a first input/output-module connector configured to accept a first input/output module;
fifth electrical interconnects that electrically couple the first compute-module connector to the first input/output-module connector;
a second input/output-module connector configured to accept a second input/output module; and
sixth electrical interconnects that electrically couple the second compute-module connector to the second input/output-module connector;
the configurable storage-system drawer further comprises the first and second input/output modules;
the first input/output module comprises:
a third connector accessible via a front of the chassis; and
a third input/output controller electrically coupled to the third connector; and
the second input/output module comprises:
a fourth connector accessible via the front of the chassis; and
a fourth input/output controller electrically coupled to the fourth connector.

9. The configurable storage-system drawer of claim 2, further comprising:
first storage drives mated to the first storage-drive connectors;
second storage drives mated to the second storage-drive connectors;
a first storage-controller module of the third type mated to the first storage-controller-module connector, the first storage-controller module comprising:
a first connector electrically coupled, via a first cable, to a second connector accessible from a front of the chassis; and
a first expander electrically coupled to the first storage drives via the first electrical interconnects; and
a second storage-controller module of the third type mated to the second storage-controller-module connector, the second storage-controller module comprising:
a third connector electrically coupled, via a second cable, to a fourth connector accessible from the front of the chassis; and
a second expander electrically coupled to the second storage drives via the second electrical interconnects.

10. The configurable storage-system drawer of claim 9, wherein:
the first and second expanders are serial-attached small-computer-system-interface expanders; and
the first, second, third, and fourth connectors are serial-attached small-computer-system-interface ports.

11. A configurable data-center rack comprising:
a first configurable storage-system drawer; and
a second configurable storage-system drawer comprising:
a first chassis;
a first passive drive-plane board comprising:
first storage-drive connectors;
a first storage-controller-module connector configured to detachably mate with two or more of a first type of storage-controller module, a second type of storage-controller module, and a third type of storage-controller module, wherein:
the first type of storage-controller module comprises one or more storage-controller components necessary for a single-server configuration of the second configurable storage-system drawer;
the second type of storage-controller module comprises one or more storage-controller components necessary for a dual-server configuration of the second configurable storage-system drawer; and
the third type of storage-controller module comprises one or more storage-controller components necessary for a just-a-bunch-of-drives configuration of the second configurable storage-system drawer;
first electrical interconnects that electrically couple the first storage-drive connectors to the first storage-controller-module connector;
second storage-drive connectors;
a second storage-controller-module connector configured to detachably mate with the first type, the second type, and the third type of storage-controller modules;
second electrical interconnects that electrically couple the second storage-drive connectors to the second storage-controller-module connector.

12. The configurable data-center rack of claim 11, wherein the first passive drive-plane board further comprises:
a first compute-module connector configured to detachably mate with a first compute module comprising a first central processing unit;
third electrical interconnects that electrically couple the first compute-module connector to the first storage-controller-module connector;
a second compute-module connector configured to detachably mate with a second compute module comprising a second central processing unit; and
fourth electrical interconnects that electrically couple the second compute-module connector to the second storage-controller-module connector.

13. The configurable data-center rack of claim 12, wherein:
the second configurable storage-system drawer further comprises:
first storage drives mated to the first storage-drive connectors;
second storage drives mated to the second storage-drive connectors;
the first compute module mated to the first compute-module connector;
a first storage-controller module of the first type mated to the first storage-controller-module connector, the first storage-controller module comprising:
a first input/output controller electrically coupled to the compute module via the third electrical interconnects;
a first expander electrically coupled to the first storage drives via the first electrical interconnects; and
a first connector electrically coupled to a second connector of a second storage-controller module of the first type via a cable; and
the second storage-controller module mated to the second storage-controller-module connector, the second storage-controller module comprising:
a second input/output controller electrically decoupled from any compute module via the fourth electrical interconnects;
a second expander electrically coupled to the second storage drives via the second electrical interconnects; and
the second connector electrically coupled to the first connector of the first storage-controller module via the cable.

14. The configurable data-center rack of claim 13, wherein:
the first and second input/output controllers are serial-attached small-computer-system-interface controllers;
the first and second expanders are serial-attached small-computer-system-interface expanders; and
the first and second connectors are serial-attached small-computer-system-interface ports.

15. The configurable data-center rack of claim 13, wherein:
the passive drive-plane board further comprises:
an input/output-module connector configured to accept an input/output module; and
fifth electrical interconnects that electrically couple the first compute-module connector to the input/output-module connector;
the second configurable storage-system drawer further comprises the input/output module; and the input/output module comprises:
a third connector accessible via a front of the chassis;
a third input/output controller electrically coupled to the third connector.

16. The configurable data-center rack of claim 12, wherein:
the second configurable storage-system drawer further comprises:
first storage drives mated to the first storage-drive connectors;
second storage drives mated to the second storage-drive connectors;
the first compute module mated to the first compute-module connector;
the second compute module mated to the second compute-module connector;
a first storage-controller module of the second type mated to the first storage-controller-module connector, the first storage-controller module comprising:
a first input/output controller electrically coupled to the first compute module via the third electrical interconnects; and
a first expander electrically coupled to the first storage drives via the first electrical interconnects; and
a second storage-controller module of the second type mated to the second storage-controller-module connector, the second storage-controller module comprising:
a second input/output controller electrically coupled to the second compute module via the fourth electrical interconnects; and
a second expander electrically coupled to the second storage drives via the second electrical interconnects.

17. The configurable data-center rack of claim 16, wherein:
the first and second input/output controllers are serial-attached small-computer-system-interface controllers; and
the first and second expanders are serial-attached small-computer-system-interface expanders.

18. The configurable data-center rack of claim 16, wherein:
the passive drive-plane board further comprises:
a first input/output-module connector configured to accept a first input/output module;
fifth electrical interconnects that electrically couple the first compute-module connector to the first input/output-module connector;
a second input/output-module connector configured to accept a second input/output module; and
sixth electrical interconnects that electrically couple the second compute-module connector to the second input/output-module connector;
the second configurable storage-system drawer further comprises the first and second input/output modules;
the first input/output module comprises:
a third connector accessible via a front of the chassis; and
a third input/output controller electrically coupled to the third connector; and
the second input/output module comprises:
a fourth connector accessible via the front of the chassis; and
a fourth input/output controller electrically coupled to the fourth connector.

19. The configurable data-center rack of claim 12, wherein:
the second configurable storage-system drawer further comprises:
first storage drives mated to the first storage-drive connectors;
second storage drives mated to the second storage-drive connectors;
a first storage-controller module of the third type mated to the first storage-controller-module connector, the first storage-controller module comprising:
a first connector electrically coupled, via a first cable, to a second connector accessible from a front of the chassis; and
a first expander electrically coupled to the first storage drives via the first electrical interconnects; and
a second storage-controller module of the third type mated to the second storage-controller-module connector, the second storage-controller module comprising:
a third connector electrically coupled, via a second cable, to a fourth connector accessible from the front of the chassis; and
a second expander electrically coupled to the second storage drives via the second electrical interconnects.

20. A method comprising:
pulling out, from a data-center rack, a configurable storage-system drawer capable of a first configuration and a second configuration, wherein:
the first and second configurations are each a different one of:
a single-server configuration;
a dual-server configuration; or
a just-a-bunch-of-drives configuration; and
the configurable storage-system drawer comprises:
a chassis;
a slide assembly coupled to a side of the chassis, the slide assembly being configured to enable the chassis to be temporarily pulled out of the data-center rack;
a first storage-system module that comprises one or more components necessary for the first configuration; and
a passive drive-plane board configured to enable storage-system modules that differ between the first configuration and the second configuration to be interchanged, the passive drive-plane board comprising:
a plurality of storage-drive connectors, each of the plurality of storage-drive connectors configured to detachably mate with a storage drive;
a storage-controller-module connector configured to detachably mate with the first storage-system module; and
a plurality of electrical interconnects that electrically couple the plurality of storage-drive connectors to the storage-controller-module connector;
removing the first storage-system module from the storage-controller-module connector;
inserting a second storage-system module into the storage-controller-module connector, the second storage-system module comprising one or more components necessary for the second configuration; and
pushing the configurable storage-system drawer back into the data-center rack.

* * * * *